(12) United States Patent
Ounadjela

(10) Patent No.: US 6,980,468 B1
(45) Date of Patent: Dec. 27, 2005

(54) HIGH DENSITY MRAM USING THERMAL WRITING

(75) Inventor: Kamel Ounadjela, Belmont, CA (US)

(73) Assignee: Silicon Magnetic Systems, San Jose, CA (US)

( * ) Notice: Subject to any disclaimer, the term of this patent is extended or adjusted under 35 U.S.C. 154(b) by 261 days.

(21) Appl. No.: 10/281,603

(22) Filed: Oct. 28, 2002

(51) Int. Cl.[7] .......................................... G11C 11/14
(52) U.S. Cl. ...................... 365/171; 365/158; 365/173
(58) Field of Search .............................. 365/171, 173, 365/158

(56) References Cited

U.S. PATENT DOCUMENTS

| | | | | |
|---|---|---|---|---|
| 5,959,880 | A * | 9/1999 | Shi et al. ..................... | 365/158 |
| 6,269,018 | B1 | 7/2001 | Monsma et al. ............. | 365/145 |
| 6,385,082 | B1 | 5/2002 | Abraham et al. ............ | 365/171 |
| 6,683,815 | B1 * | 1/2004 | Chen et al. .................. | 365/225.5 |
| 2004/0001360 | A1 * | 1/2004 | Subramanian et al. ...... | 365/188 |

* cited by examiner

Primary Examiner—Van Thu Nguyen
Assistant Examiner—Pho M. Luu
(74) Attorney, Agent, or Firm—Kevin L. Daffer; Mollie E. Lertang; Daffer McDaniel, LLP

(57) ABSTRACT

A memory cell includes a magnetic cell junction having an antiferromagnetic layer within a portion of the cell junction that is adapted to characterize a logic state of a bit written to the junction. More specifically, a memory cell includes, an antiferromagnetic layer arranged in contact with an adjacent magnetic layer within a storing portion of a magnetic cell junction. Such a magnetic cell junction configuration and a method for programming a memory cell with such a cell junction configuration may be used to improve the write selectivity of a memory cell array and reduce the amount of current needed to write a bit to a memory cell. Moreover, a memory cell includes a magnetic cell junction having an aspect ratio less than 1.6. In addition, a memory cell includes at least two resistors.

24 Claims, 6 Drawing Sheets

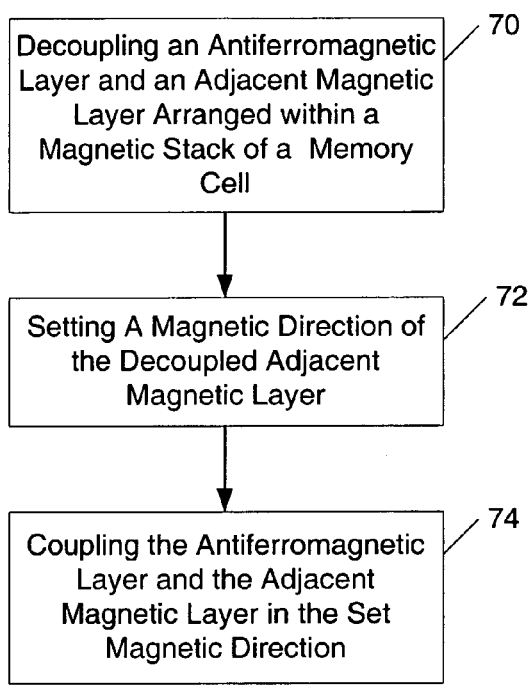

Fig. 3

Decoupling an Antiferromagnetic Layer and an Adjacent Magnetic Layer Arranged within a Magnetic Stack of a Memory Cell — 70

Setting A Magnetic Direction of the Decoupled Adjacent Magnetic Layer — 72

Coupling the Antiferromagnetic Layer and the Adjacent Magnetic Layer in the Set Magnetic Direction — 74

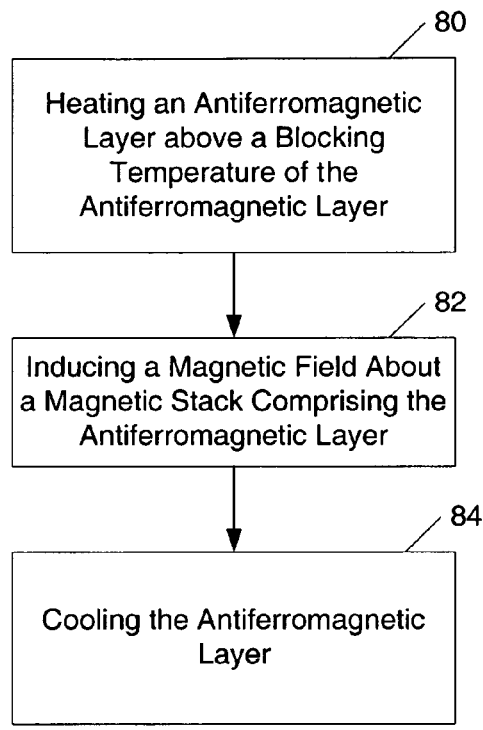

Fig. 4

Heating an Antiferromagnetic Layer above a Blocking Temperature of the Antiferromagnetic Layer — 80

Inducing a Magnetic Field About a Magnetic Stack Comprising the Antiferromagnetic Layer — 82

Cooling the Antiferromagnetic Layer — 84

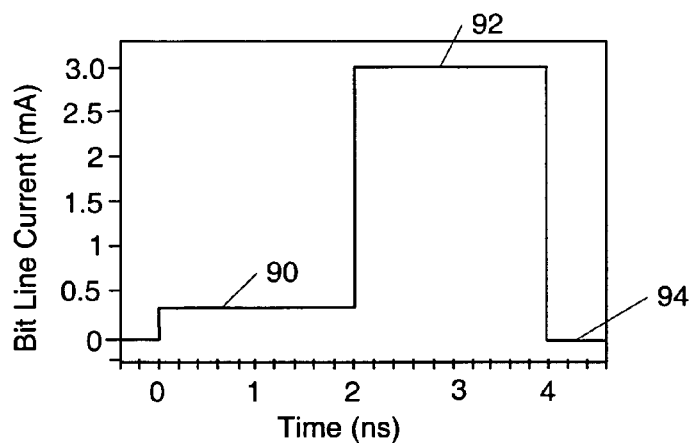

FIG. 5a

HIGH DENSITY MRAM USING THERMAL WRITING

BACKGROUND OF THE INVENTION

1. Field of the Invention

This invention relates to magnetic memory cells and, more particularly, to magnetic memory cell junction compositions and shapes. In addition, the invention relates to a method for programming a memory cell including such junctions.

2. Description of the Related Art

The following descriptions and examples are given as background information only.

Recently, advancements in the use of magnetoresistive materials have progressed the development of magnetic random access memory (MRAM) devices to function as viable non-volatile memory circuits. In general, MRAM circuits exploit the electromagnetic properties of magnetoresistive materials to set and maintain information stored within individual magnetic memory cell junctions of the circuit. In particular, MRAM circuits utilize magnetization direction to store information within a memory cell junction, and differential resistance measurements to read information from the memory cell junction. More specifically, information is stored within an MRAM cell junction as a bit, the state of which is indicated by the direction of magnetization within one magnetic layer of the memory cell relative to another magnetic layer of the memory cell. In addition, a differential resistance can be determined from differences in the magnetization directions between magnetic layers of the memory cell such that the state of the bit stored in the MRAM cell junction may be read. Such an adaptation of the MRAM cell junction may include a magnetic layer having a fixed magnetic direction. Consequently, the layer may be referred to as the "pinned magnetic layer." In addition, the layer may serve as a reference for another magnetic layer within the cell junction. The other magnetic layer, however, may be adapted to change its magnetic direction relative to the underlying pinned layer such that logic states of a bit may be stored within the magnetic cell junction. Consequently, the other magnetic layer may be referred to as the "storage layer" or "free magnetic layer."

In some cases, an MRAM cell junction may be configured to manipulate the magnetic direction of the free magnetic layer into a direction that is parallel or antiparallel to the magnetic direction of the pinned magnetic layer. Note that the term "antiparallel" is used herein to describe a magnetic direction that is oriented 180° from the reference magnetic direction of the pinned magnetic layer. In this manner, the magnetic directions of the storage and pinned layers may be aligned such that a greater differential in resistance measurements may be obtained between different logic states of a bit. For example, in some cases, a MRAM cell junction may be configured to have an elliptical shape with an elongated dimension and a relatively shortened dimension. In general, magnetic moments within layers may naturally align with the periphery of the cell junction when no external magnetic field is applied, causing the magnetic direction of the junction to be set by the shape of the layers. Consequently, a majority of magnetic moments and thus, the overall magnetic direction, of an elliptically shaped magnetic junction may be aligned along the elongated dimension of the junction. In such an embodiment, the ease or difficulty of switching the state of the magnetic cell junction may depend on the shape of the junction. As explained below, variations within cell junction sizes and shapes, however, may cause the amount of current needed to switch memory cells to vary, reducing the reliability of the device. In addition, a cell junction configuration including elongated and shortened dimensions may undesirably occupy valuable surface area within the memory cell, preventing overall dimensions of the memory cell from being reduced.

Typically, an MRAM device includes a plurality of conductive lines with which to generate magnetic fields. The conductive lines may be spaced perpendicular to each other within a plane such that overlap points exist between the lines. The magnetic cell junctions, as described above, may be interposed between the conductive lines at such overlap points. In some cases, the conductive lines may be referred to as "bit" and "digit" lines. In general, "bit" lines may refer to conductive lines arranged in contact with magnetic cell junctions that are used for both write and read operations of the magnetic junctions. "Digit" lines, on the other hand, may refer to conductive lines spaced adjacent to the magnetic cell junctions that are used primarily during write operations of the magnetic cell junctions. An individual magnetic junction can be programmed by applying current simultaneously along a bit line and a digit line corresponding to the particular magnetic junction. Such an individual magnetic junction may herein be referred to as a selected magnetic junction, or the magnetic junction intentionally targeted for a writing procedure.

During the writing procedure, however, the multitude of memory cell junctions arranged along the bit line and the digit line corresponding to the selected cell junction will also sense current. Such memory cell junctions are herein referred to as half-selected cell junctions, or disturbed cell junctions since the magnetic field induced about them is generated from either a bit line or a digit line rather than both a bit line and a digit line. Even though less current is applied to these disturbed cells, variations within the cell junctions may allow a false bit to be unintentionally written to one or more of the disturbed cells. The variations present within an array may include variations in the shapes and sizes of magnetic cell junctions, as well as the presence of defects. Such variations of the cell junctions may cause the amount of current needed to switch memory cells in the array to vary, causing the write selectivity of the array to be reduced. Write selectivity, as used herein, may refer to the relative difference (i.e., current margin) between the amount of current responsible for switching the magnetization of a disturbed cell and the amount of current needed to switch the magnetization of a selected cell.

Therefore, it would be advantageous to develop a memory cell that increases the write selectivity of a magnetic memory array. In particular, it would be advantageous to develop a memory cell which negates the issue of write selectivity with a memory array. For example, it may be advantageous to fabricate a magnetic cell junction with layers having magnetic directions that do not depend on the shape of the junction. In addition, it would be beneficial to develop a memory cell which decreases the surface area consumed by the cell such that a denser memory circuit may be effectively fabricated. Moreover, it would be additionally or alternatively beneficial to fabricate a magnetic cell junction which allows an increased differential resistance to be determined between magnetic layers of the cell junction. Such a junction may allow the logic state of the bit stored in the MRAM cell junction to be more accurately read.

SUMMARY OF THE INVENTION

The problems outlined above may be in large part addressed by a memory cell that includes a magnetic cell junction having an antiferromagnetic layer within a portion of the cell junction that is adapted to characterize a logic state of a bit written to the junction. More specifically, the antiferromagnetic layer may be arranged in contact with an adjacent magnetic layer within a storing portion of the magnetic cell junction. Such a configuration may set a unidirectional anisotropy within the storing portion, thereby allowing the magnetic direction of the storing portion to be independent of the shape of the cell junction. A method for programming a memory cell with such a cell junction configuration is also provided herein. More specifically, a method is provided which includes decoupling the antiferromagnetic layer and magnetic layer of the storing portion and subsequently setting the magnetic direction of the decoupled magnetic layer to program the logic state of a bit written to the junction. In particular, the method may include heating the magnetic cell junction to decouple the antiferromagnetic layer and the magnetic layer of the storing portion.

A memory cell junction which includes at least two resistors is also provided herein. In such a cell, a magnetic cell junction may be referred to as the plurality of layers bound by a first electrode arranged in contact with a data line of the memory cell and a second electrode arranged in contact with a contact structure of the memory cell. In some embodiments, all of the resistors may be variable resistors. In yet another embodiments, at least one of the resistors may be a fixed resistor. In either case, the inclusion of multiple resistors within the junction may allow the voltage passing through the junction to be divided, thereby preventing the maximum threshold voltage of the junction from being violated. In general, the method and the magnetic cell junction may be adapted such that the size of the memory cell described herein is reduced, increasing device density within a circuit including the memory cell. Consequently, a memory cell that includes a magnetic cell junction with a reduced lateral surface area is provided. More specifically, a memory cell including a magnetic cell junction having an aspect ratio less than approximately 1.6 is provided. Consequently, the memory cell described herein may, in some embodiments, include a surface area less than approximately 1.0 $\mu m^2$, or more specifically, less than approximately 0.5 $\mu m^2$. In some embodiments, such a magnetic cell junction may have a circular shape.

As stated above, a memory cell is provided which includes a magnetic cell junction with a storing portion adapted to characterize a logic state of a bit written to the magnetic cell junction. In particular, the storing portion may include an antiferromagnetic layer arranged in contact with an adjacent magnetic layer. In general, the magnetic cell junction may further include a reference portion adapted to retain a fixed magnetic direction for the characterization of the logic state by the storing portion. Such a reference portion may also include an antiferromagnetic layer. In this manner, the magnetic cell junction may include a plurality of antiferromagnetic layers. In some cases, the reference portion may be arranged below the storing portion. In other cases, however, the reference portion may be arranged above the storing portion.

In either embodiment, the storing portion may be interposed between a plurality of insulating layers, in some cases. In some embodiments, one or more of the plurality of insulating layers may be adapted to concentrate heat in a vicinity of the storing portion, particularly about its antiferromagnetic layer. In addition or alternatively, the plurality of insulating layers may be arranged within the magnetic cell junction such that a plurality of resistors exists within the magnetic cell junction as described above. More specifically, the plurality of insulating layers may be arranged such that they are respectively arranged between conductive layers of the cell junction. In general, one of the plurality of insulating layers may be arranged between a storing portion and a reference portion of the cell junction. In this manner, the magnetic cell junction may include a resistor which serves as a tunneling junction of the cell junction. In some embodiments, the magnetic cell junction may include another resistor which is adapted to serve as a tunneling junction of the memory cell as well. In particular, the memory cell junction may include additional storing and reference portions with which to form an additional tunneling junction, and thus an additional resistor. In such an embodiment, the two resistors may share a joint antiferromagnetic layer within their respective storing portions. In addition or alternatively, the magnetic cell junction may include a resistor having an insulating layer arranged between the storing portion of another resistor and an electrode of the magnetic cell junction. In yet another embodiments, the storing layer may not be interposed between a plurality of insulating layers.

In any case, the memory cell may further include a conductive layer coupled to the magnetic cell junction. In such an embodiment, the conductive layer may be adapted to supply current through the magnetic cell junction to heat the antiferromagnetic layer. More specifically, the conductive line may be adapted to supply a high enough current to heat the magnetic cell junction above a blocking temperature of the antiferromagnetic layer. In some cases, the memory cell may further include a thermally conductive layer interposed between the antiferromagnetic layer and the conductive layer to enhance the conduction of heat. Alternatively, the memory cell may not include such a thermally conductive layer. In either case, the conductive layer may be additionally adapted to induce a magnetic field about the magnetic cell junction to set a magnetic direction of the storing portion. In some embodiments, the memory cell may include another conductive layer spaced adjacent to the magnetic cell junction. In some cases, such a conductive layer may be adapted to heat the antiferromagnetic layer of the storing portion by flowing current through the conductive line. In addition or alternatively, the additional conductive layer may be adapted to induce a magnetic field which is strong enough to assist in setting the magnetic direction of the storing portion of the cell junction. Alternatively, the memory cell may be substantially absent of another conductive layer adapted to assist in the setting of the magnetic direction of the storing portion.

In either case, the memory cell may be adapted to supply the current vertically through the magnetic cell junction. In particular, the memory cell may include a transistor coupled to the magnetic cell junction which is adapted to receive current from the conductive layer through the magnetic cell junction. In some embodiments, the transistor may be orientated such that the current flows through the transistor in a perpendicular manner with respect to an underlying substrate of the memory cell. Alternatively, the transistor may be oriented such that the current flows through the transistor in a parallel manner with respect to the underlying substrate.

A method for writing a bit to a memory cell is also contemplated herein. Such a method may include decoupling an antiferromagnetic layer and an adjacent magnetic layer arranged within a magnetic junction of the memory cell and setting a magnetic direction of the decoupled adjacent magnetic layer. In some cases, the step of decoupling may include heating the antiferromagnetic layer above a blocking temperature of the antiferromagnetic layer and the step of setting a magnetic direction may include inducing a magnetic field about the magnetic junction. In particular, the step of heating the antiferromagnetic layer may include flowing current vertically through the magnetic junction. In addition or alternatively, the step of heating may include supplying complementary heat from a conductive line spaced adjacent to the magnetic junction. In some cases, the step of decoupling may include transforming the adjacent magnetic layer from a ferromagnetic state to a superparamagnetic state. In yet other embodiments, the step of decoupling may include maintaining the adjacent magnetic layer in a ferromagnetic state. In either embodiment, the method may further include cooling the magnetic junction of the memory cell, inducing a magnetic direction, and couple the antiferromagnetic layer and the adjacent magnetic layer in the set magnetic direction. In some cases, such a cooling step may be conducted substantially simultaneously with the step of setting the magnetic direction. In other embodiments, the cooling step may be initiated prior to or subsequent to the step of setting the magnetic direction.

There may be several advantages to fabricating the magnetic memory cell described herein. In particular, magnetic memory cell junctions may be formed with a reduced surface area, allowing higher density memory cell arrays to be fabricated. In addition, the write selectivity of magnetic memory arrays may be improved by the inclusion of an antiferromagnetic layer within the free magnetic portion of the junction. Consequently, the reliability of the device may be improved. Furthermore, the method described herein to write to a cell including an antiferromagnetic layer within the free magnetic portion of the junction allows the current requirements of the device to be decreased. In some embodiments, a memory cell may be fabricated without a digit line. As a result, the overall power requirements of a device may be lower than a device including a conventional magnetic memory cell. In addition or alternatively, a memory cell may be fabricated such that the voltage used to operate the memory cell may be divided within the magnetic cell junction of the memory cell. Such a configuration may advantageously prevent the memory cell from malfunctioning, thereby increasing the reliability of the device. In addition, such a configuration may allow the aggregate voltage induced through the junction to be increased, increasing the voltage range at which the memory cell may be operated.

BRIEF DESCRIPTION OF THE DRAWINGS

Other objects and advantages of the invention will become apparent upon reading the following detailed description and upon reference to the accompanying drawings in which:

FIG. 3 depicts a flowchart of an exemplary method for writing to a magnetic memory cell array;

FIG. 4 depicts a flowchart of exemplary manners in which the steps of the method in FIG. 3 may be conducted;

FIG. 5a depicts an exemplary temporal current graph for a writing operation of a magnetic memory cell array;

Figure 1:
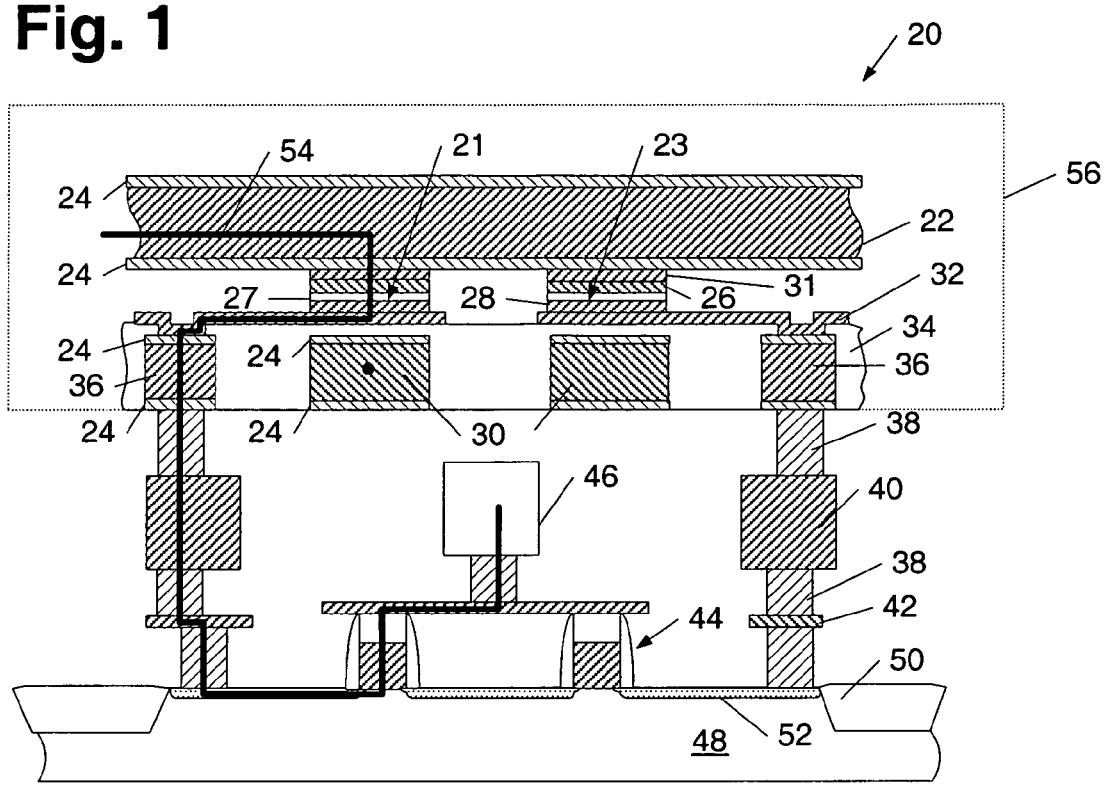
FIG. 1 depicts a partial cross-sectional view of an exemplary magnetic memory cell array including memory cell junctions.

While the invention may include various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Turning to the drawings, exemplary embodiments of memory cell array configurations are provided in FIGS. 1 and 6–9. In addition, methods for programming a memory cell having such configurations are described in reference to FIGS. 3–5. FIG. 1 depicts a partial cross-sectional view of memory array 20 which includes magnetic memory cell junctions 21 and 23 interposed between bit line 22 and digit lines 30. In this manner, memory array 20 may be part of a magnetic random access memory (MRAM) device. Magnetic memory cell junctions 21 and 23 may include storing portion 26, tunneling layer 27, and pinned portion 28, which are described in more detail below. Such memory cell junctions may alternatively be referred to as memory cells, MTJ cells, magnetic stacks, or dots and therefore, may be used interchangeably herein. Although FIG. 1 illustrates only two memory cell junctions underlying bit line 22, memory array 20 may include more than two memory cell junctions underlying bit line 22. In addition, bit line 22 may continue beyond the portion illustrated in FIG. 1, as indicated by the curved lateral edges of bit line 22. In addition, memory array 20 may include other memory cells arranged in alignment with digit lines 30 and other bit lines arranged parallel to bit line 22. Furthermore, each of the memory cells of memory array 20 may include substantially similar components. Therefore, the description of the memory cell components as described below may pertain to each of the memory cells of the array.

As shown in FIG. 1, memory array 20 further includes electrodes 31 and 32 respectively arranged as the upper and lower boundaries of memory cell junctions 21 and 23. Consequently, in some embodiments, electrodes 31 and/or 32 may be considered part of memory cell junctions 21 and 23. In yet other cases, memory cell junctions 21 and 23 may be referred to as the plurality of layers interposed between electrodes 31 and 32. In either case, electrodes 31 and 32 may be used to induce a conductive path between the memory cell junctions and overlying and underlying portions of memory array 20, respectively. In addition, electrodes 31 and 32 may further include seeding layers adapted to align the crystal structure of a layer in overlying pinned portion 28 of magnetic memory junctions 21 and 23. In yet other embodiments, the seeding layers may be considered a separate layer of memory cell junctions 21 and 23. As illustrated in FIG. 1, electrodes 31 and 32 may be spaced above dielectric layer 34 and respectively coupled to contact structures 36. In general, dielectric layer 34 may include a material and a thickness adapted to isolate electrodes 32 from underlying structures of memory array 20, such as digit lines 30 and contact structures 36. For example, dielectric layer 34 may include silicon dioxide, silicon nitride, or silicon oxynitride. Alternatively, dielectric layer 34 may include a dielectric material that is relatively thermally conductive. Such an embodiment is described in more detail below in reference to FIGS. 7 and 8.

In either case, electrodes 31 and 32 as well as contact structures 36, bit line 22, and digit lines 30 may include any conductive material such that electrical connection may be made to the structures. For example, electrodes 31 and 32, contact structures 36, bit line 22, and digit lines 30 may include doped polysilicon, aluminum, copper, platinum, titanium, tungsten, or any metal alloy thereof. In addition, the dimensions of electrodes 31 and 32, contact structures 36, bit line 22, and digit lines 30 may be in accordance with design specifications known in the MRAM fabrication industry. In some embodiments, bit line 22, digit lines 30, and contact structures 36 may further include conductive portions 24 as shown in FIG. 1. In general, conductive portions 24 may include a material that has relatively low thermal conductivity, such that heat diffusion from the structures may be reduced. For example, conductive portions 24 may include tungsten, in some cases. In this manner, the generation of heat within memory cell 20 may be minimized. Consequently, the heat generated within bit line 22 and digit lines 30 may be used to heat magnetic cell junctions 21 and 23 more efficiently for the writing operations of memory cell 20 as described in reference to FIG. 4 below. In any case embodiment, memory array 20 may further include vias 38, additional contact structures 40, interconnects 42, transistors 44, and ground line 46 formed above semiconductor substrate 48, as shown in FIG. 1. In addition, semiconductor substrate 48 may include isolation regions 50 and diffusion regions 52 self aligned to transistors 44.

In general, memory cell junctions 21 and 23 may be adapted to store a bit of information. In this manner, information may be written to and read from memory cell junctions 21 and 23. As noted above, memory cell junctions 21 and 23 may be interposed between bit line 22 and digit lines 30. In some embodiments, memory array 20 may be adapted to pass current from bit line 22 through memory cell junctions 21 and 23 such that information may be retrieved or "read" from the memory cell junctions. In such an embodiment, the current may further pass through electrodes 31 and 32 and conductors 36, 38, 40, and 42 to transistors 44 residing below. In other cases, memory array 20 may be adapted to allow information to be programmed or "written" to memory cell junctions 21 and 23. Such a write operation of memory array 20 is described in more detail below with reference to FIGS. 3–5c.

During read operations of memory array 20, magnetic cell junctions 21 and 23 may employ tunnel magnetoresistance. As such, memory cell junctions 21 and 23 may include a tunneling barrier layer interposed between at least two magnetic layers. As stated above, the memory cell junctions of magnetic memory array 20 may include storing portion 26, tunneling layer 27, and pinned portion 28. In general, tunneling layer 27 may be used to pass electrons between the magnetic layers of pinned portion 28 and storing portion 26. In this manner, the configuration of storing portion 26, tunneling layer 27, and pinned portion 28 may be referred to as a tunneling junction. In particular, a "tunneling junction", as used herein, may refer to a region of the magnetic cell junction that exchanges electrons from one portion to another portion of the cell junction. In general, the resistance of the electron states may be measured to indicate the direction of the magnetic field vector pattern of storing portion 26 relative to pinned portion 28. More specifically, tunneling layer 27 may serve to provide quantum mechanical tunneling between pinned portion 28 and storing portion 26. Exemplary materials for tunneling layer 27 may include, for instance, aluminum oxide, aluminum nitride, tantalum oxide, titanium oxide, hafnium oxide, magnesium oxide, or zirconium oxide.

In some cases, it may be advantageous to minimize the resistance within magnetic cell junctions 21 and 23. In particular, in the memory cell described herein, it may be advantageous to reduce the resistance within the magnetic cell junctions such that the amount of current conducted through the cell junctions is maximized. Such a maximization of the current may allow the junction to be heated to a desired temperature, allowing the junction to be programmed using the method described in reference to FIGS. 3–5c below. An explanation of such a writing method, including the method for heating the junction is described in more detail below in reference to such figures. One manner in which to minimize the resistance within magnetic cell junctions 21 and 23 is to fabricate tunneling layer 27 with a relatively small thickness. For example, the thickness of tunneling layer 27 may be between approximately 5 angstroms and approximately 50 angstroms and, more specifically, between approximately 6 angstroms and approximately 25 angstroms. However, larger or smaller thicknesses of tunneling layer 27 may be appropriate depending on the design specifications of the device. For example in some embodiments, the resistance of magnetic cell junctions may be additionally or alternatively minimized by the use of a material for tunneling layer 27 which has a relatively low tunneling barrier height (i.e., a material which is considered to be relatively conductive such that the layer passes electrons more easily). In this manner, the thickness of the tunneling layer may not be restricted to the thickness ranges recited above. Exemplary materials exhibiting low tunneling barrier heights may include, but are not limited to tantalum oxide, titanium oxide, hafnium oxide, and zirconium oxide.

In general, pinned portion 28 and storing portion 26 may include a plurality of layers as described in more detail below. The plurality of layers of each portion, however, is not illustrated in FIG. 1 to simplify the illustration of the drawing. Exemplary embodiments of the plurality of layers that may be included in pinned portion 28, storing 26, as well as other layers within magnetic cells junctions 21 and 23 are described in more detail below in reference to FIGS. 6–9. In general, pinned portion 28 may be adapted to have a fixed magnetic direction. More specifically, pinned portion 28 may be adapted such that its set magnetic direction is not altered by the presence of external magnetic fields. Such an adaptation of pinned portion 28 is described in more detail below in reference to FIGS. 6–9. Storing portion 26, on the other hand, may be adapted to switch its magnetic direction with the presence of external magnetic fields. In this manner, the logic state of the bit stored within magnetic cell junctions 21 and 23 may be characterized by storing portion 26 relative to pinned portion 28. More specifically, the differential resistance between the magnetic states of pinned portion 28 and storing portion 26 may be used to indicate the logic state of the bit stored within the memory cell junction. Consequently, pinned portion 28 may be used as a reference direction for the magnetic direction in storing portion 26. In such an embodiment, the magnetic directions of pinned portion 28 and storing portion 26 are preferably arranged either parallel or antiparallel to each other such that the maximum differential resistance may be measured.

In a preferred embodiment, however, the configuration of storing portion 26 may be adapted to limit its ability to change its magnetic direction by external magnetic fields. More specifically, storing portion 26 may include an antiferromagnetic layer which is adapted to stabilize the magnetic direction of an adjacent magnetic layer within storing portion 26. In this manner, external magnetic fields may not change the magnetic direction of storing portion 26 without decoupling the antiferromagnetic layer and the adjacent magnetic layer. Consequently, the antiferromagnetic layer may protect the magnetic direction of storing portion 26 from being inadvertently switched. For example, the antiferromagnetic layer may serve to prevent storing portion 26 in memory cell 21 from being switched while adjacent memory cell 23 is being programmed, or vice versa. In this manner, the antiferromagnetic layer of storing portion 26 may serve to increase the write selectivity of memory array 20. Write selectivity, as used herein, may refer to the relative difference (i.e., current margin) between the amount of current responsible for switching the magnetization of a disturbed cell and the amount of current needed to switch the magnetization of a selected cell. In addition, the current needed to write to the magnetic cell junction may be decreased with the inclusion of the antiferromagnetic layer as is described in more detail below with regard to the writing procedure outlined in FIGS. 3–5c. Configurations of storing portion 26 including such an antiferromagnetic layer is illustrated FIGS. 6–9 and described in more detail below.

Another benefit of including an antiferromagnetic layer within storing portion 26 is that the antiferromagnetic layer may allow unidirectional anisotropy of magnetic cell junctions 21 and 23 to exist rather than shape anisotropy. In other words, the antiferromagnetic layer may set the magnetic direction of storing portion 26 rather than the shape of the magnetic cell junction setting the magnetic direction of storing portion 26. In general, the "anisotropy" of a magnetic layer may refer to the preferential orientation of magnetic moments within the layer when no external magnetic field is applied. As described above, a conventional magnetic cell junction may be configured such that the anisotropy of the junction is dependent on the shape of the layer. For example, a conventional magnetic cell junction may be configured to have an elliptical shape. In general, magnetic moments of a layer may align with the periphery of a layer when no external fields and/or layers are used to influence the direction of the vectors. As such, a magnetic junction which is configure to have its anisotropy depend on the shape of the layer may be referred to having "shape anisotropy."

In some cases, configuring a magnetic junction to have shape anisotropy may also induce uniaxial anisotropy. "Uniaxial anisotropy," as used herein, may refer to a configuration in which the orientation of magnetic moments within a junction may be oriented in either one direction or another when no external field is applied. For example, an elliptically shaped magnetic cell junction which does not include an antiferromagnetic layer within its storing portion may have an anisotropy that is directed along either direction of the elongated dimension of the shape. In such a case, a magnetic field may be applied to the junction to direct the orientation of the magnetic moments into the other of the two directions. Furthermore, the magnetic moments may remain in the changed direction upon the release of the applied magnetic field.

In contrast, the magnetic cell junction provided herein may have a "unidirectional anisotropy." In general, "unidirectional anisotropy," as used herein, may refer to a configuration in which the orientation of magnetic moments within a layer is set or fixed in one particular direction when no external magnetic field is applied. More specifically, unidirectional anisotropy may refer to an orientation of the magnetic moments which cannot be changed solely by the induction of a magnetic field. Rather, a junction having unidirectional anisotropy may need to change the crystalline structure of adjacent layer within the storing portion such that the orientation of the magnetic moments within the magnetic layer may be changed by an induction of a magnetic field. In this manner, unidirectional anisotropy may be independent of the shape of the layer.

As stated above, conventional magnetic cell junctions typically include shapes with elongated and shortened dimensions in order to orient the directions of vectors within the layers of the junctions when no external field is applied. In general, the aspect ratio of the elongated and shortened dimensions in such conventional junctions typically needs to be approximately 1.6 or greater in order to induce such shape anisotropy. "Aspect ratio," as used herein, may refer to the ratio between the length and width of a magnetic cell junction taken along a plan view of the junction. It is noted that, in some embodiments, the length of a magnetic junction may refer to the longer of two dimensions oriented perpendicular to each other and the width may refer to the smaller of the two dimensions. In yet other embodiments, the length and the width of the magnetic junctions described herein may be equal (i.e., the junction is circular). In particular, since the magnetic junction described herein exploits the use of unidirectional anisotropy rather than shape anisotropy, magnetic cell junctions of any shape may be used in the memory cell described herein. More specifically, magnetic cell junctions having aspect ratios less than approximately 1.6 may be used in the memory cells described herein as well as magnetic cell junctions having aspect ratios equal to or greater than approximately 1.6.

Figure 2A:
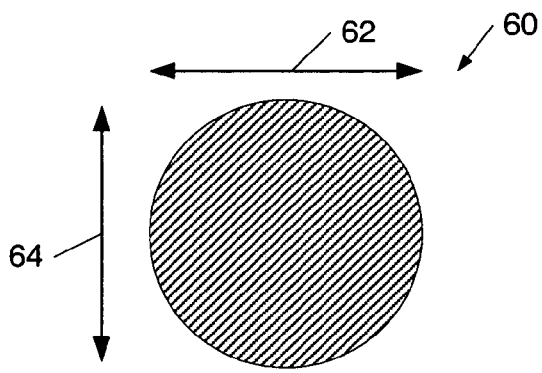
FIG. 2a depicts an exemplary top view of one of the memory cell junctions in FIG. 1.
Figure 2B:
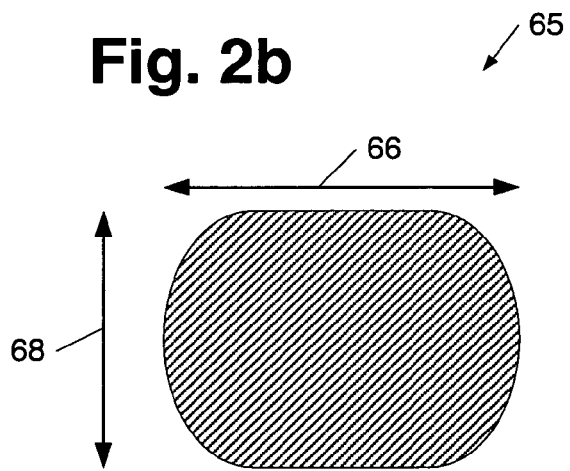
FIG. 2b depicts a top view, in an alternative embodiment, of one of the memory cell junctions in FIG. 1.

Exemplary shapes of magnetic cell junctions 21 and 23 including aspect ratios less than approximately 1.6 are shown in FIGS. 2a and 2b. In particular, FIG. 2a illustrates a top view of a magnetic cell junction including circular shape 60. Since length 62 and width 64 are equal in a circular shape, the magnetic cell junction, in such an embodiment, has an aspect ratio of 1.0. In another embodiment, magnetic cell junctions 21 and/or 23 may include shape 65 as shown in FIG. 2b. In such an embodiment, length 66 may be slightly larger than width 68. In particular, the dimensions of length 66 and width 68 may be sized relative to each other such that the aspect ratio of shape 65 is less than approximately 1.6. In other embodiments, the magnetic cell junctions may include a shape with an aspect ratio equal to or greater than approximately 1.6. In either case, the lengths and widths of shapes 60 and 65 may generally be between approximately 0.1 $\mu$m and approximately 1.0 $\mu$m. However, larger or smaller dimensions may be used for lengths 62 and 66 and widths 64 and 68, depending on the design specifications of the device and the technology available for fabricating small dimensions.

In general, surface areas of magnetic cell junctions described herein may be between 100 nm$^2$ and 40,000 nm$^2$. However, magnetic cell junctions with larger or smaller surface areas may be fabricated, depending on the technology available for fabricating such junctions. In some cases, it may be advantageous for the magnetic cell junction described herein to be fabricated with a relatively small surface area. In particular, magnetic cell junctions with relative small surface areas may allow a larger current density to be induced within the junction, thereby increasing the amount of heat that may be used for the write operation of the memory cell as described in more detail in reference to FIGS. 3–5c. In addition, the ferromagnetic/superparamagnetic thickness threshold for magnetic layers with small surfaces areas may be lower. In this manner, the free magnetic layer within the storing portion of the magnetic cell junction may be more easily adapted to be transformed into a superparamagnetic state during the write operation of the memory cell. Such superparamagnetic state may allow the magnetic direction of the free layer to be set with lower magnetic field magnitude, reducing the overall power requirements of the device. In general, the "ferromagnetic/superparamagnetic thickness threshold" may refer to the thickness of a magnetic layer at which the layer changes from a ferromagnetic state to a superparamagnetic state. A further explanation of such states and its affect on the writing operation of the memory cell described herein is further described in reference to FIGS. 3 and 4, below.

In general, both of the configurations depicted in FIGS. 2a and 2b may be advantageous for reducing the lateral surface area of a memory cell. More specifically, the shape and size of the magnetic cell junctions described above may allow a memory cell to be fabricated with a lateral surface area less than approximately 1.0 $\mu$m$^2$ and in some embodiments, less than approximately 0.5 $\mu$m$^2$. In this manner, a memory cell may occupy less space within an array and consequently, a denser memory array may be fabricated. In general, a memory cell may include one or more memory cell junctions and the circuitry used to read and write from the junctions. As such, the lateral surface area of a memory cell may include the size of the magnetic cell junctions, electrodes, underlying transistors, and any contact structures used to electrically connect the components. In addition, the lateral surface area of a memory cell may further include portions of the bit and digit lines used at the intersection of the magnetic cell junctions.

Returning to FIG. 1, current path 54 is illustrated originating in bit line 22 flowing through magnetic cell junction 21 to ground line 46. Such a current path may be indicative of a read operation of memory array 20, as described above. In other embodiments, however, current path 54 may be indicative of a writing procedure for memory array 20 as described in reference to FIGS. 3–5c. In particular, FIG. 3 illustrates a flow chart of a writing operation of a memory cell including a storing portion with an antiferromagnetic layer. FIG. 4, on the other hand, illustrates exemplary manners in which each of the steps of FIG. 3 may be conducted. It is noted that FIG. 4 merely illustrates examples in which the steps of FIG. 3 may be conducted. Other methods known in the magnetoresistance materials industry for conducting such steps may be used and therefore, the steps outlined in FIG. 3 may not be limited or restricted by the steps outlined in FIG. 4.

As shown in FIG. 3, the method for writing a bit to the memory cell described herein may include decoupling an antiferromagnetic layer and an adjacent magnetic layer arranged within a storing portion of the memory cell. Consequently, the stability of the magnetic direction within the storing portion may be lessened during such a step. In other words, the magnetic direction of the storing portion may be less likely to stay in a certain direction. In some embodiments, step 70 may be conducted, for example, by heating the antiferromagnetic layer above a blocking temperature of the antiferromagnetic layer as shown in step 80 of FIG. 4. In general, the blocking temperature of an antiferromagnetic layer, which may also or alternatively referred to as the "Neel temperature" is the temperature at which the local magnetic moments within the layer change from a stable state to an unstable state. More specifically, the blocking temperature of an antiferromagnetic layer is the temperature at which the layer transforms from an antiferromagnetic material to a paramagnetic material.

"Antiferromagnetic," as used herein, may refer to the state of a material having magnetic moments oriented in opposite directions relative to each other. In particular, an antiferromagnetic material may include magnetic moments arranged in fixed directions oriented antiparallel to each other such that they counterbalance each other, rendering an overall magnetic direction of the material nonexistent. On the other hand, "paramagnetic" may refer to a state in which the magnetic moments within a layer are arranged in a variety of directions such that the magnetic direction of the layer cannot be determined. Consequently, an antiferromagnetic layer relinquishes its own coupling property at its blocking temperature. As a result, the interfacial coupling between an antiferromagnetic layer and an adjacent ferromagnetic layer may no longer exist (i.e., the layers are decoupled) and the adjacent magnetic layer may be "free" to change magnetic directions.

In a preferred embodiment, the antiferromagnetic layer included in storing portion 26 has a relatively low blocking temperature such that the amount of heat needed to switch the magnetic direction of the free magnetic layer in storing portion 26 is low. For example, in some embodiments, the blocking temperature of an antiferromagnetic layer included in storing portion 26 may be between approximately 100° C. and approximately 250° C., or more specifically at approximately 200° C. As such, the step of heating the antiferromagnetic layer may include exposing the memory cell to such temperatures. In general, the exposure of the memory cell to such temperatures is preferably limited such that the atomic structure of the magnetic layers within the magnetic cell junction is not altered. More specifically, the exposure of the memory cell to such temperatures is preferably limited such that the layers of the magnetic cell junction do not interdiffuse with one another. As such, in some cases, it may be advantageous to minimize the time at which the heating step is conducted. For example, in some embodiments, the duration of the heating step may be approximately 10 nanoseconds or less. In addition or alternatively, the heating step may include a series short pulses of heat.

In any case, the step of heating the antiferromagnetic layer may include routing current through the magnetic cell junction supplied from the bit line to an underlying transistor as shown by current path 54 in FIG. 1. Such a current path may be formed by turning "on" underlying transistor 44 such that current supplied from bit line 22 may pass vertically through magnetic cell junction 21 to the transistor. In general, such a heating step may include an application of current between approximately 200 $\mu$A and approximately 400 $\mu$A or, more specifically, at approximately 300 $\mu$A. Such a current level may be enough to heat the antiferromagnetic layer above its blocking temperature, but low enough such that the voltage induced through the magnetic cell junction is below the breakdown voltage of the magnetic cell junction. Such a heating step is distinct from the read operation of the memory cell in that a current level for a read operation is typically between approximately 20 $\mu$A and approximately 40 $\mu$A. In this manner, the current level used during the read operation may not undesirably decouple the storing portions of magnetic cell junctions arranged along bit line 22. In some embodiments, transistor 44 may be oriented such that current flows through the transistor in a perpendicular manner with respect to underlying substrate 48. Such a transistor is referred to as a vertical transistor and is illustrated in FIG. 1. In such a configuration, transistor 44 may be advantageously adapted to receive the current level used to heat the antiferromagnetic layer without increasing the lateral surface area of the memory device. In yet other embodiments, however, transistors 44 may be oriented such that current flows in a parallel manner with respect to underlying substrate 48.

In some cases, the antiferromagnetic layer of the storing portion may be additionally or alternatively heated by a digit line arranged within the memory cell such that the blocking temperature of the antiferromagnetic layer may be reached. Such an application of heat may be induced by current applied along the digit line to radiate to the selected memory cell. For example, the application of current may be between approximately 1 mA and approximately 4 mA. In some embodiments, such an application of current may advantageously allow the current applied to the bit line during the heating step to be reduced. Although such an application of current along the digit line may induce a magnetic field about the magnetic cell junctions arranged along the digit line, the strength of the magnetic field may not be large enough to switch the magnetic direction of the storing portions of such junctions since the induced magnetic field is applied along the hard axes of the junctions. In other embodiments, the blocking temperature of the antiferromagnetic layer may be reached without heat induced through such a digit line.

In any embodiment, once the temperature of the antiferromagnetic layer has been increased above its blocking temperature, the magnetic direction of the adjacent magnetic layer (i.e., the free magnetic layer) may not be fixed in one particular direction. As explained in more detail below, in some embodiments, decoupling the antiferromagnetic layer and adjacent magnetic layer may include changing the state of the adjacent magnetic layer from a ferromagnetic state to a superparamagnetic state. In yet other embodiments, decoupling the antiferromagnetic layer and adjacent magnetic layer may not affect the state of the adjacent magnetic layer. In such an embodiment, the adjacent magnetic layer may remain in a ferromagnetic state during the write operation of the cell junction. In general, "ferromagnetic" may refer to a state in which the magnetic moments within a layer are arranged generally along the same direction. In other words, "ferromagnetic" may refer to a state in which a magnetic direction of the layer may be determined by the overall direction of the magnetic moments within the layer. In contrast, "superparamagnetic" may refer to a state in which the magnetic moments within a layer are arranged in fixed directions relative to each other, but move relative to the anistropic orientation of the layer. In other words, the directions of magnetic moments within a superparamagnetic material are unstable relative to the direction of the anisotropy orientation of the layer. Consequently, an overall magnetic direction cannot be determined for a material in such a state. In general, a superparamagnetic state may be induced by reducing the dimensions of the layer below a certain threshold such that the directions of the magnetic moments are not fixed relative to the anistropic orientation of the layer.

Figure 7:
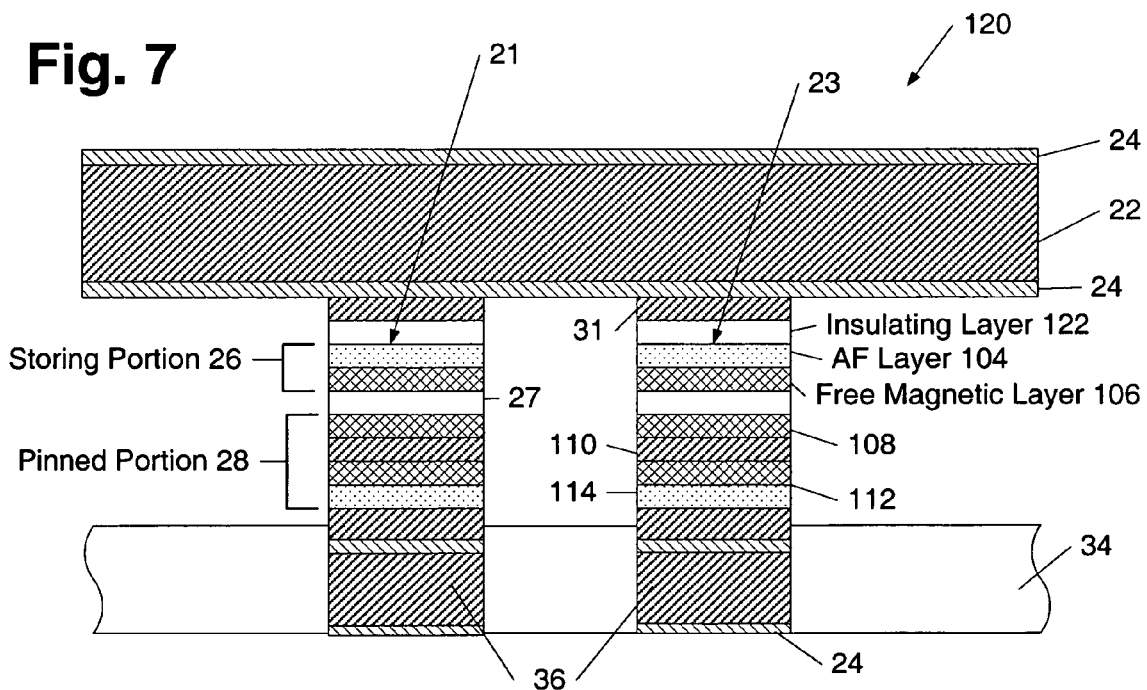
FIG. 7 depicts a partial cross-sectional view of the upper portion of the magnetic memory array of FIG. 1 in an alternative embodiment.
Figure 8:
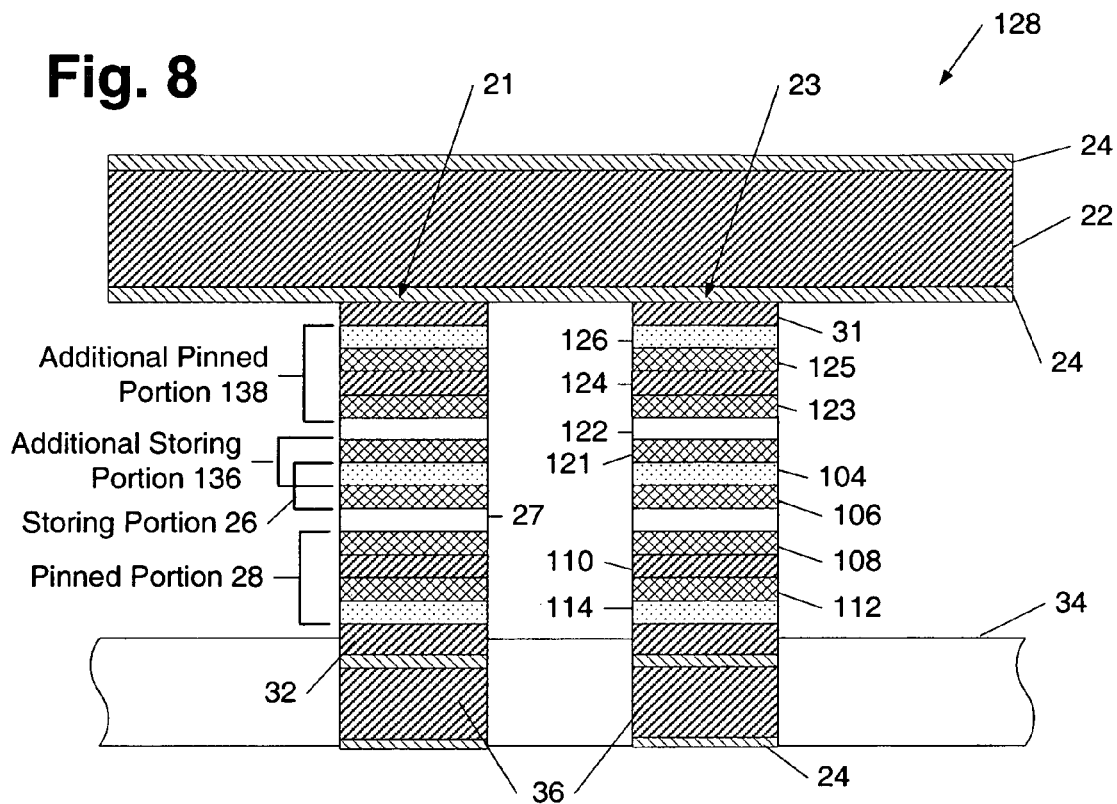
FIG. 8 depicts a partial cross-sectional view of the upper portion of the magnetic memory array of FIG. 1 in an alternative embodiment.

In either case, the writing procedure described herein may consequently include setting a magnetic direction of the decoupled adjacent magnetic layer as shown in step 72 of FIG. 3. Such a step may be conducted by inducing a magnetic field about the magnetic cell junction as shown in step 82 of FIG. 4. In some embodiments, such a magnetic field may be induced by the bit line and the digit line. For example, the application of current used to induce the magnetic field may include a bit line current between approximately 0.5 mA and approximately 5.0 mA and a digit line current between approximately 1.0 mA and approximately 4.0 mA in some embodiments. Larger or smaller currents, however, may be applied to the bit line and/or the digit line, depending on the design specifications of the device. In yet other embodiments, a magnetic field induced by both a bit line and a digit line may not be necessary in the writing procedure described herein. In other words, since an antiferromagnetic layer is used to stabilize the magnetic direction of the storing portion within a magnetic cell junction, corresponding bit and digit lines may not be needed to enhance the write selectivity of an array. As such, in some embodiments, the magnetic field induced during the step of 82 may be primarily induced by the bit line. In this manner, the digit line may be omitted from the memory cell configuration in some embodiments. Such a case may be advantageous for reducing the lateral surface area occupied by the memory cell, since underlying contact structures may be aligned directly below the magnetic cell junction. Embodiments including such a configuration are illustrated in FIGS. 7 and 8 and are further described below.

In either embodiment, the writing procedure may further include coupling the antiferromagnetic layer and the adjacent magnetic layer in the set magnetic direction as shown in step 74 in FIG. 3. Consequently, in some embodiments, step 74 may include changing the state of the adjacent magnetic layer from a superparamagnetic state to a ferromagnetic state. In yet other embodiments, the step of coupling the antiferromagnetic and the adjacent magnetic layer in a set magnetic direction may not affect the state of the adjacent magnetic layer. In particular, step 74 may induce the adjacent magnetic layer in a state other than a ferromagnetic state. In either embodiment, such a coupling process may include cooling the antiferromagnetic layer as shown in step 84 in FIG. 4. In particular, step 84 may include terminating the application of heat applied to the antiferromagnetic layer during step 80. More specifically, the vertical current applied through the magnetic cell junction may be discontinued by either turning "off" the underlying transistor and/or discontinuing the current applied to the bit line. As will be described in more detail below in reference to FIG. 5a, the current applied to the bit line may not be discontinued in some embodiments, but rather may be increased to induce the magnetic field by which the magnetic direction of the adjacent magnetic layer may be set. In such an embodiment, turning "off" the transistor prior to the increase in bit line current is advantageous such that the increased current is not exposed to the transistor. Such a surge of current may undesirably damage the transistor, causing the device to malfunction.

Consequently, the step of cooling the antiferromagnetic layer (step 84) may be initiated prior to the step of inducing a magnetic field about the magnetic junction (step 82) in some cases. In other embodiments, the step of cooling the antiferromagnetic layer may be initiated at substantially the same time or subsequent to the step of inducing a magnetic field about the magnetic junction. In any embodiment, however, the process of cooling the antiferromagnetic layer may be longer than the step of inducing the magnetic field since the process of cooling the antiferromagnetic layer may include reducing the temperature of the layer back to the temperature at which it was prior to heating step 80. In this manner, the magnetic direction of the adjacent magnetic layer may be set prior to the layer being coupled with the antiferromagnetic layer.

In some embodiments, the antiferromagnetic layer may continue to be heated during the step of setting the magnetic direction of the adjacent magnetic layer. In such an embodiment, the vertical current applied to the magnetic cell junction may be discontinued, but the current applied to a digit line may continue such that the storing portion may continue to be heated. In yet other embodiments, current may be initiated at the point at which the vertical current is discontinued. In either case, such a heating sequence may allow the storing portion to be unstable for a longer period of time to insure the magnetic direction may be set. As such, the starting point of the step of cooling of the antiferromagnetic layer, in such an embodiment, may be either at the point at which the vertical current through the magnetic cell junction is discontinued or at the point the current to the digit line is discontinued. As such, in some embodiments, the step of cooling the antiferromagnetic layer may be initiated subsequent to the step of inducing a magnetic field about the magnetic junction.

Figure 5B:
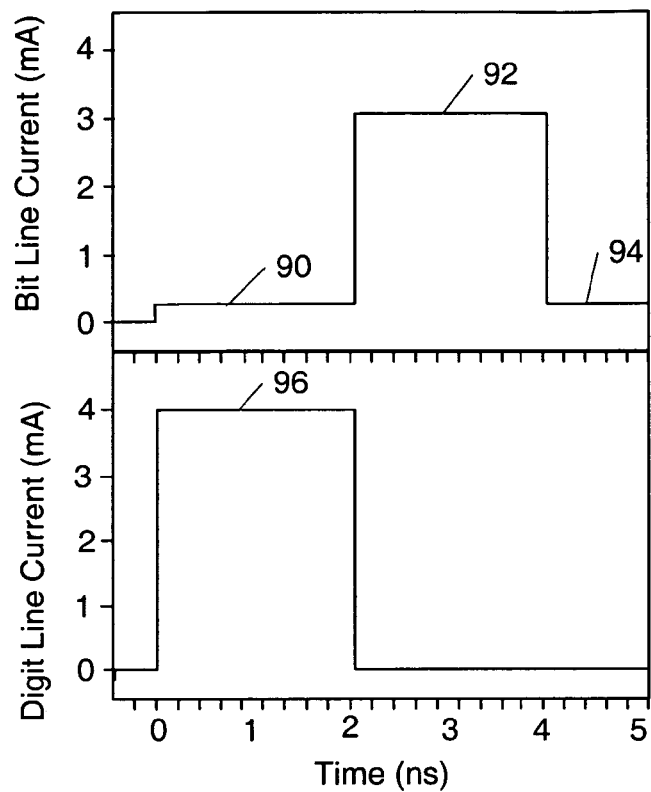
FIG. 5b depicts a temporal current graph, in an alternative embodiment, for a writing operation of a magnetic memory cell array.
Figure 5C:
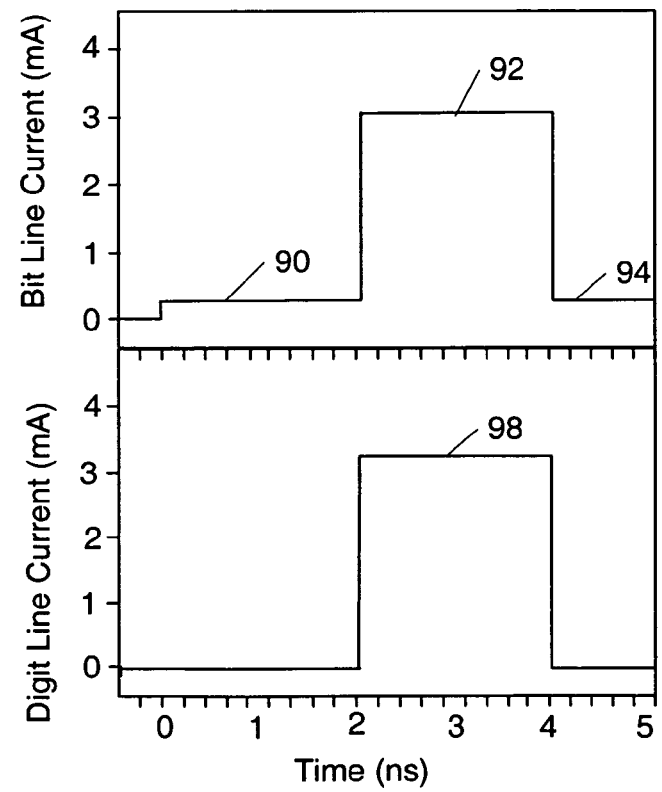
FIG. 5c depicts a temporal current graph, in yet another alternative embodiment, for a writing operation of a magnetic memory cell array.

FIGS. 5a–5c illustrate exemplary temporal current applications for the write procedure described in reference to FIGS. 3 and 4. In particular, FIG. 5a depicts the current application to a bit line during a write procedure of a memory cell. Such an embodiment is substantially absent of current applied to the digit line and therefore, the digit line current versus time graph is not shown in FIG. 5a. In such an embodiment, current may applied to the bit line at low level 90 to heat the antiferromagnetic layer prior to being applied at high level 92 in which the current may induce a magnetic field large enough to set the magnetic direction of the decoupled adjacent magnetic layer. In general, the current applied at level 90 is preferably large enough to heat the antiferromagnetic layer above its blocking temperature. For example, level 90 may be between approximately 200 $\mu$A and approximately 400 $\mu$A, or more specifically approximately 300 $\mu$A. Larger or smaller current levels, however, may be used, depending on the design specifications of the device. In addition, current may be applied at level 90 for a time period between approximately 0.1 ns and approximately 10.0 ns. However, longer or shorter time periods for level 90 may be used, depending on the design specifications of the device.

As stated above, current applied at level 92 may be used to induce a magnetic field by which to set the magnetic direction of the decoupled adjacent magnetic layer. In this manner, level 92 may range from approximately 0.5 mA to approximately 5.0 mA. However, larger or smaller current levels may be appropriate, depending on the design specifications of the device. For example, in an embodiment in which the decoupled adjacent magnetic layer is in a superparamagnetic state, a relatively small amount of current level may be used since lower levels of current are generally needed to orient the directions of vectors within a superparamagnetic state as compared to vectors within a ferromagnetic state. Similar to the application of current at level 90, level 92 may be applied for a time period between approximately 0.1 ns and approximately 10.0 ns. Longer or shorter time periods for level 92 may be used, however, depending on the design specifications of the device. It is noted that the values depicted for the applications of current in FIG. 5a for level 90 as well as level 92 and the values depicted in FIGS. 5b and 5c are merely shown as exemplary embodiments and, therefore, should not limit the magnitude or time by which currents are applied in the method described herein. Subsequent to setting the magnetic direction of the decoupled adjacent magnetic layer, current to the bit line may be discontinued as indicated by level 94.

FIG. 5b illustrates yet other exemplary temporal graph of current applied during a write procedure of a memory cell. In particular, FIG. 5b illustrates the application of current along both a bit line and a digit line. Such an embodiment is shown to illustrate the digit line being used to additionally heat the antiferromagnetic layer. FIG. 5b illustrates the application of current applied to the bit line to be similar to that of FIG. 5a and, therefore, may include similar current levels and time durations to that of FIG. 5a. In addition, FIG. 5b illustrates an application of current at level 96 along a digit line during the decoupling step of the antiferromagnetic layer and the adjacent magnetic layer. Current at level 96 may include any level able to generate heat from the digit line to the antiferromagnetic layer. Such a range may between, for example, approximately 1 mA and approximately 4 mA. The duration of such an application of current may range between approximately 0.1 ns or 10.0 ns. Longer or shorter time durations and/or larger or smaller current levels, however, may be used for current applied to the digit line for level 96, depending on the design specifications of the device.

In other embodiments (not shown), the application of current along the digit line may continue through the entire writing procedure. Such an embodiment may be particularly advantageous in embodiments in which the application of heat from the digit line is desirable to maintain the decoupling of the antiferromagnetic layer and the adjacent magnetic layer for a longer period of time. Such an embodiment may be additionally or alternatively advantageous in embodiments in which the magnetic field induced by the digit line is needed to switch the magnetic direction of the decoupled adjacent magnetic layer. The continuation of current along the digit line, in such an embodiment, may include maintaining the current at level 96, increasing the current above level 96, or decreasing the current below level 96. In yet in another embodiment (not shown), the step of decoupling of the antiferromagnetic layer and the adjacent magnetic layer may solely include the application of heat from the digit line and rather than from the bit line.

FIG. 5c illustrates yet another exemplary temporal graph of current applied during a write procedure of a memory cell. In particular, FIG. 5c illustrates an embodiment in which current is applied to the digit line during the step of setting the magnetic direction of the decoupled adjacent magnetic layer. In this manner, the current applied to the digit line as shown in FIG. 5c may be used to induce a field about the magnetic junction in addition to the magnetic field induced by the current applied to the bit line such that the magnetic direction may be set. In addition or alternatively, the current applied to the digit line may be used to heat the antiferromagnetic layer while the magnetic direction of the decoupled adjacent magnetic layer is being set by the magnetic field induced by the current applied to the bit line. Such an embodiment may first heat the antiferromagnetic layer by current level 90 applied to the bit line, but then continue to heat the layer with the initiation of current at level 98 along the digit line as shown in FIG. 5c. Current level 98 may be applied between approximately 1 mA and approximately 4 mA for a duration between approximately 0.1 ns and approximately 10.0 ns. Different current levels and time durations, however, may be used for the application of current to the digit line, depending on the design specifications of the device.

FIGS. 6–9 depict exemplary configurations of upper portions of memory cell arrays having magnetic cell junctions with an antiferromagnetic layer included in their storing portions. In particular, FIGS. 6–9 depict exemplary configurations of portion 56 of memory array 20 outlined by the dotted line in FIG. 1. As noted above, components of memory array 20 are not drawn to scale. As such, the portions of memory array 20 illustrated in FIGS. 6–9 are not drawn to scale. In particular, the memory cell junctions of FIGS. 6–9 are greatly exaggerated to emphasize the layers of memory cell junctions 21 and 23. In general, the thickness of memory cell junctions 21 and 23 may be on the order of hundreds of angstroms while the thickness of bit line 22 and digit lines 30 may be on the order of thousands of angstroms.

Figure 6:
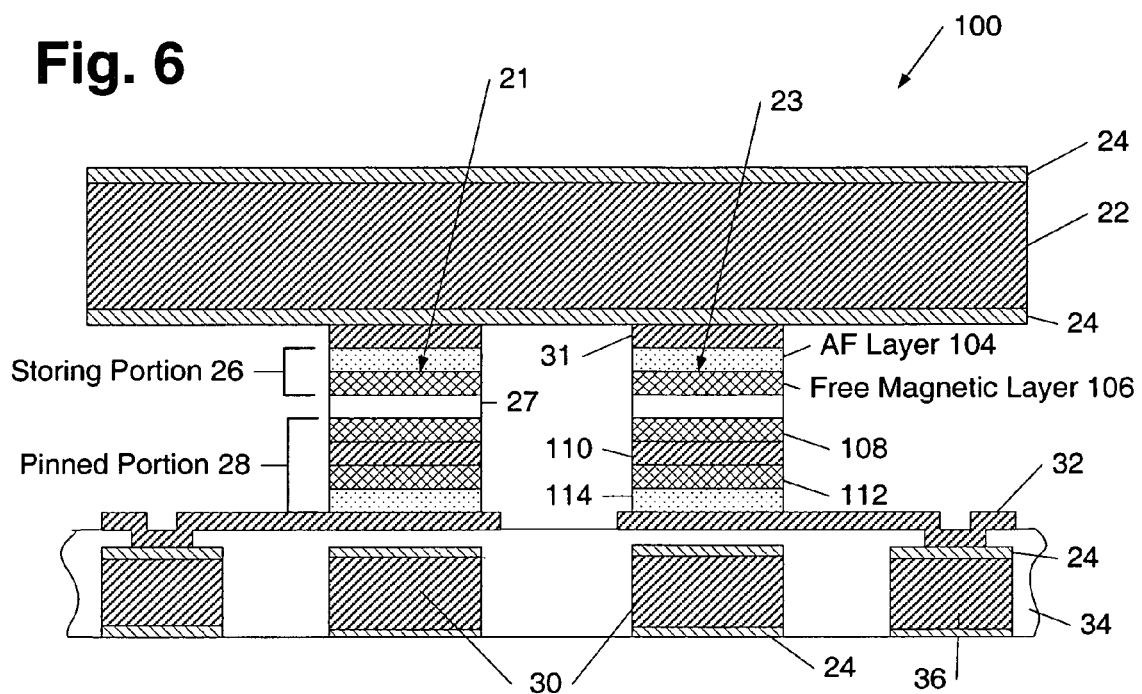
FIG. 6 depicts an exemplary partial cross-sectional view of the upper portion of the magnetic memory array of FIG. 1.

Memory array portion 100 is shown in FIG. 6 including layers 104–114 within memory cell junctions 21 and 23. More specifically, storing portion 26 and pinned portion 28 of memory cell junctions 21 and 23 are shown to include layers 104–114. In general, pinned portion 28 may include magnetic layer 112 and high temperature antiferromagnetic (AF) layer 114. High temperature AF layer 114 may be adapted to set and orient the magnetic direction of magnetic layer 112. More specifically, high temperature AF layer 114 may be adapted to set the magnetic direction of magnetic layer 112 such that the magnetic direction is not easily altered by the presence of external magnetic fields. In this manner, pinned portion 28 may be used as a reference direction for the magnetic direction in storing portion 26. Consequently, magnetic layer 112 may be referred to as a "pinned magnetic layer." In general, the fabrication of a memory cell junction having pinned portion 28 may include coupling the magnetic directions of high temperature AF layer 114 and magnetic layer 112 such that a stable magnetic direction may be obtained. Such a stable magnetic direction may be difficult to switch with low magnetic fields. For example, the stable magnetic direction may be difficult to switch with magnetic fields ranging between approximately 100 Oe and approximately 400 Oe. In fact, the coupled magnetic direction between high temperature AF layer 114 and magnetic layer 112 may be able to withstand magnetic fields a high as approximately 800 Oe or 1200 Oe without switching the magnetic direction of magnetic layer 112.

The process of coupling the magnetic directions of the two layers may include exposing the memory cell junction to a relatively high temperature and concurrently applying a magnetic field in the desired direction. For example, the process may include exposing the memory cell junction to a temperature between approximately 300° C. and approximately 400° C. Such an exposure, however, is distinct from the decoupling process of storing portion 26 during a write operation of the device as described in more detail below. In particular, the temperature of the decoupling process of storing portion 26 may be between approximately 100° C. and approximately 200° C., significantly lower than the relatively high temperatures used for the coupling process of pinned portion 28.

In general, materials which may be used for high temperature AF layer 114 may include magnetic materials which are adapted to orient and pin the magnetic direction of layers at such relatively high temperatures. For instance, high temperature AF layer 114 may include antiferromagnetic materials such as alloys of platinum-manganese (Pt—Mn), nickel-manganese (Ni—Mn), osmium-manganese (Os—Mn), platinum-palladium-manganese (Pt—Pd—Mn), and platinum-manganese-chromium (Pt—Mn—Cr), for example. Other antiferromagnetic materials, however, may be appropriate for high temperature AF layer 114 depending on the design specifications of the device. In general, the blocking temperature for an antiferromagnetic layer increases with the thickness of the layer. As such, it may be advantageous for high temperature AF layer 114 to have a relatively large thickness. For example, the thickness of high temperature AF layer 114 may be between approximately 100 angstroms and 400 angstroms, in some embodiments. Other thicknesses of high temperature AF layer 114 may be appropriate, however, depending on the design specifications of the device.

As stated above, "antiferromagnetic," as used herein, may refer to the state of a material having magnetic moments oriented in opposite directions relative to each other. In particular, an antiferromagnetic material may include magnetic moments arranged in fixed directions oriented antiparallel to each other such that they counterbalance each other, rendering an overall magnetic direction of the material nonexistent. In contrast, "ferromagnetic" may refer to a state in which the magnetic moments within a layer are fixed in generally the same direction or are, in other words, arranged parallel to each other. In this manner, "ferromagnetic" may refer to a state in which a magnetic direction of the layer may be determined by the overall direction of the magnetic moments within the layer.

On the other hand, "paramagnetic" may refer to a state in which the magnetic moments within a layer are arranged in a variety of directions such that the magnetic direction of the layer cannot be determined. In general, such a paramagnetic state may be induced within a ferromagnetic material or an antiferromagnetic material upon increasing the temperature of the material above a certain threshold. In general, the thresholds for ferromagnetic and antiferromagnetic materials are referred to as the "Curie" temperature and the "Neel" temperature, respectively. A "superparamagnetic" material, however, may refer to a state in which the magnetic moments within a layer are arranged in fixed directions relative to each other, but move relative to the anisotropy orientation of the layer. In other words, the directions of the magnetic moments within a superparamagnetic material are unstable relative to the direction of the anisotropy orientation of the layer. Consequently, an overall magnetic direction cannot be determined for a material in such a state. In general, a superparamagnetic state may be induced by reducing the dimensions of the layer below a certain threshold such that the directions of the magnetic moments are not arranged along a fixed direction relative to the anisotropy orientation of the layer.

Since the magnetic direction of magnetic layer 112 is preferably pinned or fixed in a particular direction, the material used for magnetic layer 112 may include any magnetic material, such as cobalt-iron, nickel-iron, nickel-iron-cobalt alloys, cobalt-zirconium-niobium, or cobalt-iron-boron, which are in a ferromagnetic state. Other magnetic materials that are used in the MRAM fabrication industry, however, may also or alternatively be used for magnetic layer 112, depending on the design specifications of the device. In general, the state of a magnetic material to be in a ferromagnetic state or a superparamagnetic state may be dependent on the thickness and the surface area occupied by the material. In particular, a layer with a certain surface area may be in a ferromagnetic state with a thickness greater than a particular threshold and may be in a superparamagnetic state with a thickness less than the particular threshold. For example, a nickel-iron layer having a surface area of approximately 10,000 $nm^2$ may have a ferromagnetic/superparamagnetic thickness threshold of approximately 20 angstroms. As such, the thickness of magnetic layer 112, in such an embodiment, may be greater approximately 20 angstroms. More specifically, the thickness of magnetic layer 112 may be between approximately 20 angstroms and approximately 100 angstroms or between approximately 20 angstroms and approximately 50 angstroms, in such an embodiment. Every material, however, may have their own specific threshold. Consequently, the thickness of magnetic layer 112 may depend on the material used for magnetic layer 112 as well as the surface area occupied by magnetic junctions 21 and 23.

In general, the magnetic field generated from one magnetic layer may affect the magnetic direction of adjacent layers. As such, in order to prevent the magnetic field of pinned portion 28 from influencing the magnetic direction of the free layer in storing portion 26, the overall magnetic moment within pinned portion 28 should be substantially zero. Such an overall magnetic moment may be achieved by counteracting the magnetic field generated from magnetic layer 112. More specifically, pinned portion 28 may be fabricated with an additional magnetic layer having a magnetic direction set in a substantially opposite direction than magnetic layer 112. As such, pinned portion 28 may further include setting layer 110 and magnetic layer 108 formed above magnetic layer 112. In particular, pinned portion 28 may also include setting layer 110 interposed between magnetic layer 108 and magnetic layer 112. In yet other embodiments, pinned portion 28 may be absent of an additional magnetic layer and a setting layer. As such, although the embodiments provided herein include setting layer 110 and magnetic layer 108, the embodiments are not restricted to the inclusion of such layers.

In general, setting layer 110 may be used to set the magnetic direction of magnetic layer 108 in a direction opposite (i.e., antiparallel) to the magnetic direction of magnetic layer 112. Consequently, magnetic layer 108 may be referred to as a "fixed magnetic layer." More specifically, setting layer 110 may include a material which has an inherent property to set the magnetic direction of an adjacent magnetic material in an opposite direction than another adjacent material. For example, setting layer 110 may include ruthenium or any other material comprising such a property. Advantageously, the inclusion of setting layer 110 and magnetic layer 108 may make pinned portion 28 even more difficult to switch with the application of external magnetic fields. In other words, larger external magnetic fields may be needed to switch a reference magnetic direction in embodiments in which pinned portion 28 includes an additional magnetic layer and a setting layer as described herein. In general, the thickness of setting layer 110 may be between approximately 5 angstroms and approximately 15 angstroms. However, larger or smaller thicknesses of setting layer 110 may be used, depending on the design specifications of the device.

In general, the material used for magnetic layer 108 may be similar to that of magnetic layer 112. As such, magnetic layer 108 may include any magnetic material, such as cobalt-iron, nickel-iron, nickel-iron-cobalt alloys, cobalt-zirconium-niobium, or cobalt-iron-boron, which is in a ferromagnetic state. In this manner, the thickness of magnetic layer 108 may be between approximately 20 angstroms and approximately 100 angstroms, and more specifically between approximately 20 angstroms and approximately 50 angstroms. Materials and/or thicknesses that differ from magnetic layer 112, however, may be used for magnetic layer 108, depending on the design specifications of the device. In addition, different thicknesses and/or materials than the ones listed for magnetic layer 112 may be used for magnetic layer 108, depending on the design specifications of the device. In some embodiments, magnetic layer 108, as well as magnetic layer 112, may include a plurality of layers. For example, in some embodiments, magnetic layers 108 and 112 may include a plurality of magnetic materials in ferromagnetic states. In some cases, the plurality of magnetic layers may include the same material. In other embodiments, the plurality of ferromagnetic layers may include different materials.

As stated above, storing portion 26 may be adapted to allow the magnetic direction of magnetic layer 106 to be switched during writing operations of magnetic memory array 20. More particularly, storing portion 26 may be adapted such that the magnetic orientation of magnetic layer 106 is able to rotate relative to the magnetic direction of magnetic layer 112. Consequently, magnetic layer 106 may be referred to as a "free magnetic layer". As shown in FIG. 6, storing portion 26 may further include low temperature antiferromagnetic (AF) layer 104. In general, low temperature AF layer 104 may serve to orient and set the magnetic direction of magnetic layer 106 during write operations of memory array 20. The process of orientating the magnetic direction of magnetic layer 106 during such a write operation is described in more detail above in reference to FIGS. 3–5c. In addition, low temperature AF layer 104 may be used to strengthen the magnetic direction of magnetic layer 106, particularly during read operations or more particularly during write operations of unselected magnetic cell junctions. In this manner, low temperature AF layer 104 may serve to protect the magnetic direction of magnetic layer 106 from being inadvertently switched within disturbed cell junctions. More specifically, low temperature AF layer 104 may prevent an unselected memory cell junction from being switched while a selected magnetic cell junction is being programmed. For example, low temperature AF layer 104 may prevent magnetic layer 106 from being switched in magnetic cell junction 21 while magnetic cell junction 23 is being programmed, or vice versa.

Consequently, low temperature AF layer 104 may serve to increase the write selectivity of magnetic memory array 20. Write selectivity, as used herein, may refer to the relative difference (i.e., current margin) between the amount of current responsible for switching the magnetization of a disturbed cell and the amount of current needed to switch the magnetization of a selected cell. In addition, low temperature AF layer 104 may allow the unidirectional anisotropy of magnetic cell junctions 21 and 23 rather than shape anisotropy as used in conventional magnetic cell junctions. More specifically, low temperature AF layer 104 may set the magnetic direction of magnetic layer 106, rather than being set by the shape of magnetic cell junctions 21 and 23. In this manner, the shape of magnetic cell junctions 21 and 23 may include an aspect ratio less than approximately 1.6 and, in some embodiments, may be circular. Exemplary memory cell junctions with such aspect ratios are described above in reference to FIGS. 2a and 2b. In yet other embodiments, magnetic cell junctions 21 and 23 may include as an aspect ratio equal to or greater than approximately 1.6.

Materials which may be used for low temperature AF layer 104 may include materials adapted to orient and pin the magnetic direction of magnetic layer 106. For instance, low temperature AF layer 104 may include antiferromagnetic materials such as alloys of iridium-manganese (Ir—Mn), or more specifically an alloy including 20% iridium and 80% manganese, for example. Other antiferromagnetic materials, however, may be appropriate for low temperature AF layer 104 depending on the design specifications of the device. For example, low temperature AF layer 104 may alternatively include an alloy of iron-manganese, or more specifically an alloy including 50% iron and 50% manganese. In any case, an antiferromagnetic material may generally be more resistive than other conductive materials. Since resistance generally generates heat, the inclusion of an antiferromagnetic material within the storing portion of the magnetic cell junction may advantageously concentrate a relatively large amount of heat within the storing portion as compared to other regions within the magnetic cell junction. Such a conduction of heat may be particularly useful for reaching the blocking temperature of the antiferromagnetic layer.

As stated above, the blocking temperature for an antiferromagnetic layer increases with the thickness of the layer. As such, it may be advantageous for low temperature AF layer 104 to have a relatively small thickness. For example, the thickness of low temperature AF layer 104 may be between approximately 20 angstroms and 100 angstroms or more specifically, approximately 50 angstroms. Other thickness of low temperature AF layer 104 may be appropriate, however, depending on the design specifications of the device. Consequently, in a preferred embodiment, low temperature AF layer 104 may include a material with a relatively low blocking temperature such that the amount of heat needed to switch the magnetic direction of the free layer in storing portion 26 is low. For example, in some embodiments, low temperature AF layer 104 may include a material having a low blocking temperature between approximately 100° C. and approximately 250° C., or more specifically approximately 200° C. In this manner, the temperature used to heat low temperature AF layer 104 and, thus switch the magnetic direction of magnetic layer 106, may be between approximately 100° C. and approximately 250° C., or more specifically approximately 200° C. As noted above, the exposure of the memory cell to such temperatures is preferably limited such that the atomic structure of the magnetic layers within the magnetic cell junction is not altered. As such, in some cases, it may be advantageous to minimize the time low temperature AF layer 104 is heated. For example, in some embodiments, the duration of the heating step may be approximately 10 nanoseconds or less. In addition or alternatively, the heating step may include a series short pulses of heat.

In general, magnetic layer 106 may include any magnetic material, such as cobalt-iron, nickel-iron, nickel-iron-cobalt alloys, cobalt-zirconium-niobium, or cobalt-iron-boron, for example. Other magnetic materials used in the MRAM fabrication industry, however, may also or alternatively be used for magnetic layer 106, depending on the design specifications of the device. In general, magnetic layer 106 may be in a ferromagnetic state when it is coupled to low temperature AF layer 104. As such, in some embodiments, the material deposited for magnetic layer 106 may be in a ferromagnetic state. In yet other embodiments, however, the material deposited for magnetic layer 106 may be in a superparamagnetic state. In such an embodiment, the superparamagnetic state of magnetic layer 106 may change to a ferromagnetic state upon coupling with low temperature AF layer 104. In addition, the ferromagnetic state may change to the superparamagnetic state when magnetic layer 106 is decoupled from low temperature AF layer 104.

In some cases, depositing magnetic layer 106 in a superparamagnetic state may be desirable. In particular, the strength of a magnetic field needed to switch magnetic layer 106 may be lower when magnetic layer 106 is in a superparamagnetic state versus a ferromagnetic state. As such, the amount of current needed to write to magnetic cell junctions 21 and 23 may be lower in a case in which magnetic layer 106 is deposited in a superparamagnetic state, reducing the overall power requirements of the array. In some cases, the current need to write to magnetic cell junctions 21 and 23 may be at the edge of the superparamagnetic threshold, which corresponds to the lowest current able to switch the junctions. In addition, depositing magnetic layer 106 in a superparamagnetic state may allow the state of a selected cell to change during a write operation of an array while the state of the unselected cells will remain in a ferromagnetic state, further distinguishing the magnetization fields required to switch the selected cell versus the unselected cells. Consequently, the write selectivity of the device may be further enhanced in an embodiment in which magnetic layer 106 is deposited in a superparamagnetic state.

As stated above, the thickness and the surface area occupied by a material may determine whether the material is in a ferromagnetic or superparamagnetic state. As such, the state in which magnetic layer 106 is deposited may depend on the design specifications of the device. In some embodiments, it may be advantageous to deposit magnetic layer 106 in a ferromagnetic state. As such, in an embodiments in which magnetic layer 106 includes a ferromagnetic/superparamagnetic thickness threshold of approximately 20 angstroms, for example, magnetic layer 106 may include a thickness greater than approximately 20 angstroms. In some cases, magnetic layer 106, in such an embodiment, may be between approximately 20 angstroms and approximately 100 angstroms. In yet other embodiments, magnetic layer 106 may be deposited in a superparamagnetic state and, therefore, may include a thickness less than approximately 20 angstroms. For example, in some cases, the thickness of magnetic layer 106 may be between approximately 10 angstroms and approximately 20 angstroms, in such an embodiment.

As stated above, the ferromagnetic/superparamagnetic thickness threshold of a layer is generally dependent on the material used for the layer and the surface area occupied by the magnetic cell junction. Therefore, larger or smaller thicknesses of magnetic layer 106 may be used in the memory cell described herein, depending on the material used for the layer and the thickness and surface area of the layer. As such, magnetic layer 106 is not restricted to the aforementioned exemplary thicknesses. In any case, magnetic layer 106 may include a plurality of layers in some embodiments. Such a plurality of layers may be substantially the same or different. In particular, the plurality of layers may be deposited having superparamagnetic and/or ferromagnetic properties. In yet other embodiments, magnetic layer 106 may include a single layer of magnetic material.

As shown in FIG. 6, memory array 20 may include electrode 31 interposed between storing portion 26 and bit line 22. In general, electrode 31 may serve to electrically connect conductive structures or layers within memory array 20. As such, electrode 31, as well as electrode 32, may include doped polysilicon or any metal material, such as aluminum, cobalt, copper, iron, nickel, nickel-iron-chromium, platinum, tantalum, titanium, tungsten, or a metal alloy or silicide thereof. In some embodiments, electrode 31 may include a metal including high thermal conductivity properties such that the blocking temperature of low temperature AF layer 104 may be reached. For example, electrode 31 may preferably include tungsten in some cases. Such a layer of high thermal conductivity may advantageously draw heat toward low temperature AF layer 104 within storing portion 26. In other embodiments, however, the blocking temperature of low temperature AF layer 104 may be reached without electrode 31 including a metal with such high thermal conductivity properties. In any case, the thickness of electrode 31 may be between approximately 20 angstroms and approximately 500 angstroms, and more specifically between approximately 100 angstroms and approximately 200 angstroms. However, larger or smaller thicknesses of electrode 31 may be appropriate depending on the design specifications of the device.

FIG. 7 illustrates portion 56 of memory array 20 in a different embodiment. In particular, FIG. 7 illustrates memory array portion 120 including bit line 22, storing portion 26, and pinned portion 28. In general, bit line 22, storing portion 26, and pinned portion 28 of FIG. 7 may be similar to the respective layers of memory array portion 100 in FIG. 6. As such bit line 22, storing portion 26, and pinned portion 28 of FIG. 7 may include similar materials and thicknesses as those described in FIG. 6. FIG. 7, however, differs from FIG. 6 in that digit lines are excluded from the memory cell configurations. In this manner, memory array portion 120 may be substantially absent of another conductive line which to induce a magnetic field about magnetic cell junctions 21 and 23. Alternatively stated, memory array portion 120 may be substantially absent of another conductive line which is adapted to set the magnetic direction of the magnetic cell junctions during a write operations of the memory cell.

Consequently, the current supplied to memory cell junctions 21 and 23 to heat low temperature AF layer 104, in such an embodiment, may be primarily conducted from bit line 22. In addition, bit line 22 may be the only conductive line adapted to set the magnetic direction of magnetic layer 106. As a result, the write selectivity of such a device may be negated, since the only memory cell junction with a decoupled storing layer is the cell junction in which current has flowed from bit line 22 to an underlying transistor. As shown in FIG. 7, the placement of contact structures 36 may be rearranged to reside directly beneath magnetic cell junctions 21 and 23. In this manner, the conductive path to underlying transistors 44 may be reduced, improving the speed of the read operation of the array. In addition, the length of electrodes 32 may reflect the width of magnetic cell junctions 21 and 23. In yet other embodiments, the placement of contact structures 36 and the length of electrodes 32 may be the same as in FIG. 6 when digit lines are excluded from memory array 20.

Another difference between memory array portion 120 of FIG. 7 and memory array portion 100 of FIG. 6 is memory cell junctions 21 and 23 of memory array portion 120 may include an additional insulating layer. More specifically, memory cell junctions 21 and 23 of memory array portion 120 may include insulating layer 122 interposed between electrode 31 and low temperature AF layer 104. In this manner, low temperature AF layer 104 may be interposed between two insulating layers (i.e., insulating layer 122 and tunneling layer 30). Such a configuration may be adapted concentrate heat applied to the magnetic cell junction in a vicinity of low temperature AF layer 104. In this manner, a lower current may be supplied from bit line 22 to decouple low temperature AF layer 104 and magnetic layer 106 than in a configuration that does not include an additional insulating layer, such as the embodiment shown in FIG. 6.

In general, insulating layer 122 may include any dielectric material. For example, in the embodiment of FIG. 7, insulating layer 122 may include a material which may adequately insulate low temperature AF layer 104. As such, insulating layer may include silicon dioxide or silicon nitride, in some cases. In addition, the thickness of insulating layer 122 may be between approximately 10 angstroms and approximately 50 angstroms such that low temperature AF layer 104 is sufficiently insulated. Larger or smaller thicknesses and/or other insulating materials, however, may be used for insulating layer 122, depending on the design specifications of the device. For example, in some embodiments, as described in more detail below in reference to FIG. 8, insulating layer 122 may be used for a tunneling junction of the magnetic cell junctions and thus, may be adapted to pass electrons between overlying and underlying materials. Exemplary materials for insulating layer 122, in such an embodiment, may include, for instance, aluminum oxide, aluminum nitride, tantalum oxide, titanium oxide, hafnium oxide, magnesium oxide, or zirconium oxide. In addition, the thickness of insulating layer 122, in such an embodiment, may be similar to the thickness of tunneling layer 107. For example, the thickness of insulating layer 122 may be between approximately 5 angstroms and approximately 50 angstroms and, more specifically, between approximately 6 angstroms and approximately 25 angstroms.

In any case, the plurality of insulating layers within magnetic cell junctions 21 and 23 may advantageously incorporate a plurality of resistors within the magnetic cell junctions. In particular, the inclusion of insulating layer 122 interposed between electrode 31 and low temperature AF layer 104 may produce a fixed resistor within magnetic cell junctions 21 and 23. In addition, magnetic cell junctions 21 and 23 may further include the variable resistor of tunneling layer 27 arranged between storing portion 26 and pinned portion 28. In this manner, the resistors may be arranged in series within the magnetic cell junctions. Consequently, the voltage passing through the junctions may be divided, allowing a higher current to be used for the operation of the memory cell. More specifically, the memory cell may be operated with a wider range of current without exceeding the threshold voltage of the cell junctions. In some conventional memory cell junctions, a voltage greater than 1.5 volts may cause a magnetic junction to breakdown. The inclusion of multiple resistors within the magnetic cell junctions described herein, however, may allow an aggregate voltage greater than 1.5 volts to pass through the cell junctions. In some embodiments, more than two insulating layers may be arranged within the memory cell junction to further divide the voltage passing through the junction.

In some embodiments, however, the inclusion of a fixed resistor within the magnetic cell junctions may undesirably reduce the tunnel magnetoresistance (TMR) of the junction. In general, TMR is the value used to measure the distinction between low resistance and high resistance states of a memory cell. More specifically, TMR is the difference in resistance between different logic states of the memory cell divided by the resistance of the memory cell in a low resistance state. Since a fixed resistor contributes the same amount of resistance in the magnetic junction in the low and high resistance states, the inclusion of such a fixed resistor may undesirably decrease the difference between the low and high resistance states of the magnetic cell junction. Consequently, the TMR value of a device including a fixed resistor within a magnetic cell junction may be lower than a device which does not include a fixed resistor. Consequently, the logic state of a device with a fixed resistor may be more difficult to determine. As such, FIG. 8 illustrates an exemplary configuration of an upper portion of memory array 20 including a plurality of variable resistors within magnetic cell junctions 21 and 23. More specifically, FIG. 8 illustrates memory array portion 128 with two variable resistors arranged within each of magnetic cell junctions 21 and 23, as described in more detail below.

It is noted that the inclusion of an additional insulating layer and the exclusion of digit lines in the embodiment illustrated in FIG. 7 are not mutually exclusive for the device described herein. In other words, other embodiments of upper portions of memory array 20 may include an additional insulating layer while still including digit lines. Likewise, other embodiments of upper portions of memory array 20 may not include digit lines as well as additional insulating layers.

As shown in FIG. 8, memory array portion 128 may include a similar layer configuration as memory array portion 120 in FIG. 7. In particular, memory array portion 128 may include bit line 22 arranged in contact with magnetic junctions 21 and 23. In addition, memory array portion 128 may be absent of digit lines. In other embodiments, however, memory array portion 128 may include digit lines spaced adjacent to magnetic junctions 21 and 23. In either case, magnetic junctions 21 and 23 of memory array portion 128 may each include pinned portion 28, storing portion 26, and additional insulating layer 122. In general, bit line 22, storing portion 26, and pinned portion 28 of FIG. 8 may be similar to the respective layers of memory array portion 120 in FIG. 7. As such bit line 22, storing portion 26, and pinned portion 28 of FIG. 8 may include similar materials and thicknesses as those described in FIG. 7. Memory array portion 128 of FIG. 8 differs from memory array portion 120 of FIG. 7, however, by the inclusion of additional pinned portion 138 arranged upon additional insulating layer 122. In addition, memory array portion 128 includes additional magnetic layer 121 interposed between additional insulating layer 122 and low temperature AF layer 104 and as a result, includes additional storing portion 126.

In general, additional pinned portion 138 may include a similar composition of layers as pinned portion 28. More specifically, additional pinned portion 138 may include high temperature AF layer 126, which is adapted to set the magnetic direction of magnetic direction of magnetic layer 125, such that magnetic layer 125 may be a "pinned magnetic layer." Furthermore, additional pinned portion 138 may include setting layer 124 with which to set the magnetic direction of magnetic layer 123 in a substantially opposite direction from magnetic layer 125 such that the overall magnetic field induced by additional pinned portion 138 may be substantially zero. In this manner, magnetic layer 125 may be referred to as a "fixed magnetic layer." In general, the layers of additional pinned portion 138 may include a similar materials and thicknesses as those listed for the respective layers included in pinned portion 28. As such, high temperature AF layer 126 may include similar materials and thicknesses as those listed for high temperature AF layer 114. In addition, magnetic layer 125 and 123 may include similar materials and thicknesses as those listed for magnetic layers 112 and 108, respectively. Moreover, setting layer 124 may include a similar material and thickness as those listed for setting layer 110.

Furthermore, additional storing portion 136 may include a similar composition of layers as storing portion 26. In particular, the composition of additional magnetic layer 121 may be similar to magnetic layer 106 in storing portion 26. As such, additional magnetic layer 121 may be deposited in either a ferromagnetic or superparamagnetic state, depending on the thickness of the layer, material used for the layer, and the surface area occupied by the layer. In addition, additional magnetic layer 121 may couple with low temperature AF layer 104, and, therefore, may have its magnetic direction stabilized by low temperature AF layer 104. Moreover, upon decoupling with low temperature AF layer 104, additional magnetic layer 121 may be "free" to switch its magnetic direction. Consequently, additional magnetic layer 121 may be referred to as a "free magnetic layer." In this manner, low temperature AF layer 104 may serve as a joint antiferromagnetic layer for storing portion 26 and storing portion 136.

Consequently, insulating layer 122 may be adapted to pass electrons between magnetic layers 123 and 125. Likewise, tunneling layer 27 may be adapted to pass electrons between magnetic layers 106 and 108. In this manner, memory array portion 128 may include two tunneling junctions. Alternatively stated, memory array portion 128 may have a double junction configuration within magnetic cell junctions 21 and 23. As a result, memory array portion 128 may include two variable resistors in series within magnetic cell junctions 21 and 23. More specifically, magnetic cell junctions 21 and 23 may include a variable resistor with tunneling layer 30 interposed between storing portion 26 and pinned portion 28 and another variable resistor with additional insulating layer 122 serving as a tunneling layer between additional storing portion 138 and additional pinned portion 138.

In a preferred embodiment, additional magnetic layer 121 and magnetic layer 106 may be adapted to have the same magnetic direction. More specifically, additional magnetic layer 121 and magnetic layer 106 may be adapted to change their magnetic directions upon the induction of the same magnetic field. Alternatively stated, it may be advantageous for the switching mechanisms of additional magnetic layer 121 and magnetic layer 106 to be substantially similar such that different magnetic field magnitudes are not needed to change the magnetic directions of the layers. In this manner, the relative difference in resistance within each of the tunneling junctions (i.e., the resistors) of the magnetic cell junctions may be the same. Consequently, the minimum resistance of the junction may be produced when the magnetic directions of the storing portions are parallel to the magnetic directions of the pinned portions and the maximum resistance may be produced when the magnetic directions of the storing portions are antiparallel to the magnetic directions of the pinned portions.

Figure 9A:
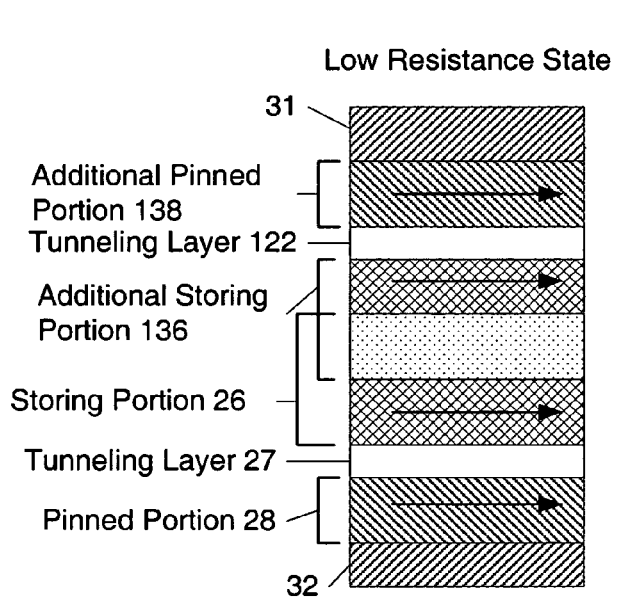
FIG. 9a depicts a partial cross-sectional view of one of the magnetic cell junctions of FIG. 8 in a low resistance state.
Figure 9B:
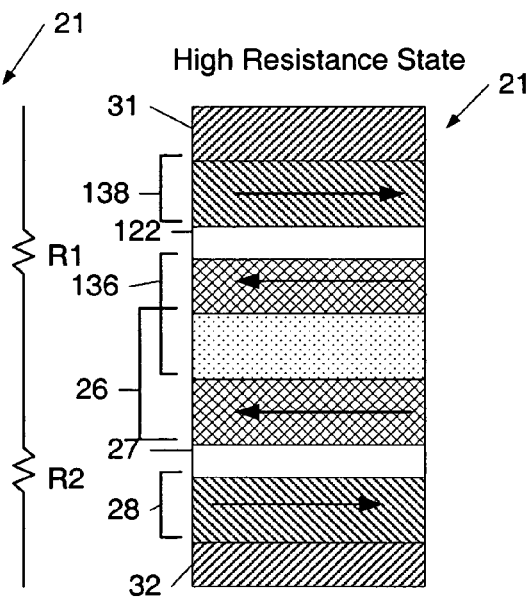
FIG. 9b depicts a partial cross-sectional view of one of the magnetic cell junctions of FIG. 8 in a high resistance state.

Exemplary embodiments illustrating such low and high resistance states within magnetic cell junctions having two variable resistors are illustrated in FIGS. 9a and 9b, respectively. In particular, FIG. 9a illustrates magnetic cell junction 21 of memory array portion 128 in a low resistance state. In contrast, FIG. 9b illustrates magnetic cell junction 21 of memory array portion 128 in a high resistance state. It is noted that the layer configurations of magnetic cell junction 21 in FIGS. 9a and 9b include the same configuration as illustrated in FIG. 8. In particular, tunneling layer 122 is interposed between additional pinned portion 138 and additional storing portion 136. Furthermore, tunneling layer 27 is interposed between pinned portion 28 and storing portion 26. However, the layer configurations of pinned portion 28 and additional pinned portion 138 have been condensed into a single layer as shown in FIGS. 9a and 9b to simplify the illustration of the drawings. Therefore, the illustrations of FIGS. 9a and 9b do not restrict the layer configurations of pinned portion 28 and additional pinned portion 138 to have only one layer.

As depicted in FIGS. 9a and 9b, the magnetic direction of the storing and pinned portions within magnetic cell junction 21 may be illustrated by bold arrows included within the respective portions of the junction. For example, the magnetic directions of pinned portion 28 and additional pinned portion 138 may be arranged in a direction pointed to the right as illustrated in FIGS. 9a and 9b. In other embodiments, the magnetic directions of pinned portion 28 and additional pinned portion 138 may be alternatively arranged in a direction pointed to the left. In either case, the magnetic directions of the pinned portions are preferably oriented in the same direction such that a maximum tunnel magnetoresistance measurement may be obtained for the junction. In particular, the magnetic directions of the pinned portions are preferably oriented such that parallel or antiparallel directions may be set in both tunneling junctions at the same time. Furthermore, the pinned portion 28 and additional pinned portion 138 are specifically adapted to maintain their magnetic directions in a fixed direction such that they may serve as reference layers for storing portion 26 and additional storing portion 138, respectively. Consequently, the magnetic directions of pinned portion 28 and additional pinned portion 138 may be maintained between FIGS. 9a and 9b.

As shown in FIG. 9a, storing portion 26 and additional storing portion 136 may be arranged parallel to the magnetic directions of pinned portion 28 and additional pinned portion 138, respectively, to define a "low resistance state" of the cell junction. In particular, the magnetic directions of storing portion 26 and additional storing portion 136 may be directed toward the right in the embodiment depicted in FIG. 9a. Alternatively, the magnetic directions of storing portion 26 and additional storing portion 136 may be directed toward the left in an embodiment in which the magnetic directions of the pinned portions are directed toward the left. In either case, the magnetic directions of the storing portions are preferably oriented in the same direction such that a low resistance state within each of the tunneling junctions may be obtained within magnetic cell junction, thereby allowing the lowest overall resistance state within the junction to be obtained.

A "high resistance state" of magnetic cell junction 21, as shown in FIG. 9b, may alternatively have the magnetic directions of storing portion 26 and additional storing portion 136 arranged antiparallel to the magnetic directions of pinned portion 28 and additional pinned portion 138, respectively. In particular, FIG. 9b illustrates the magnetic directions of storing portion 26 and additional storing portion 136 directed in opposite directions relative to the magnetic directions of pinned portion 28 and additional pinned portion 138, respectively. As stated above, the magnetic directions of the storing portions are preferably oriented in the same direction. As a result, a high resistance state within each of the tunneling junctions may be obtained within magnetic cell junction, thereby allowing the highest overall resistance state within the junction to be obtained.

Consequently, the differential resistance between the resistance states of FIGS. 9a and 9b may offer the highest TMR measurement for a junction which includes two variable resistors. In particular, the tunnel magnetoresistive resistance (TMR) measurement of a junction including such a series of tunneling junctions may be larger than a TMR measurement taken during the operation of a memory cell comprising the configuration depicted in FIG. 7. Consequently, a device including a magnetic cell junction with two variable resistors may be more advantageous than a device having a fixed resistor arranged in series with a variable resistor. Furthermore, the addition of another variable resistor within magnetic junctions 21 and 23 may advantageously allow the voltage applied to the junctions to be divided. Consequently, a larger current may be used to heat the junction during a write operation of the device.

As noted between FIGS. 9a and 9b, each of the resistance states may include resistance R1 and R2 indicating the distinction of the variable resistors within the junction. In general, the values of R1 and R2 may vary depending on the design specifications of the device, the current applied through the junctions, and whether the junction is in a high or low resistance state. However, the inclusion of two variable resistors within the magnetic junctions described herein may generally allow a voltage greater than approximately 1.5 volts at the node of the double tunnel barrier junction. In addition, the inclusion of two variable resistors (i.e, two tunneling junctions) may advantageously allow magnetic cell junctions 21 and 23 to store two bits. In yet other embodiments, a plurality of additional storing portions, additional pinned portions, and additional tunneling layers may be included in magnetic cell junctions 21 and 23 such that more than two bits may be stored within the junctions. Such a configuration may include more than two resistors within magnetic cell junctions 21 and 23 and, therefore, may be used to further distribute a voltage used to operate the array comprising the junctions.

It is noted that although FIG. 8 illustrates the formation of additional storing portion 136 and additional pinned portion 138 above storing portion 26 to form an additional resistor within magnetic cell junctions 21 and 23, other configurations may be used to form a resistor within the cell junctions. For example, storing portion 136 and additional pinned portion 138 may be formed below pinned portion 28, in some embodiments. More specifically, additional pinned portion 138 may be formed below pinned portion 28 and additional storing portion 136 may be formed below additional pinned portion 138. In such an embodiment, storing portion 136 may include a low temperature AF layer that is distinct from low temperature AF layer 104. In addition, such an embodiment may include an insulating layer interposed between the two pinned portions to create a fixed resistor within magnetic cell junctions 21 and 23 as well as two variable transistors at each of the tunneling junctions. In yet other embodiments, magnetic cell junctions 21 and 23 may not include additional pinned portion 138, but may rather have additional storing portion 136 arranged directly beneath pinned portion 26. In such an embodiment, pinned portion 28 may serve as a reference portion for both storing portion 26 and additional storing portion 136. Consequently, such an embodiment may include two variable resistors without the inclusion of a fixed resistor.

Figure 10:
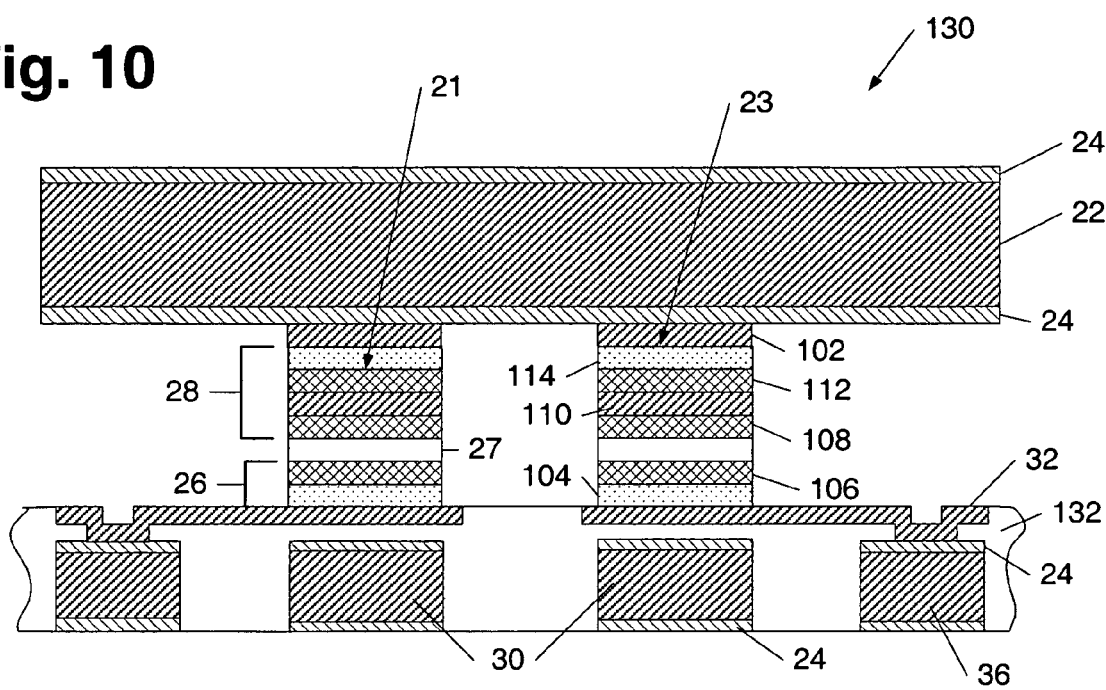
FIG. 10 depicts an exemplary partial cross-sectional view of the upper portion of the magnetic memory array of FIG. 1 in yet another embodiment.

FIG. 10 illustrates an upper portion configuration of memory array 20 in yet another embodiment. In particular, FIG. 10 illustrates memory array portion 130 including memory cell junctions 21 and 23 interposed between bit line 22 and digit lines 30. As in FIGS. 6–8, memory cell junctions 21 and 23 of magnetic memory array 130 may include storing portion 26 and pinned portion 28. In general, bit line 22, digit lines 30, storing portion 26, and pinned portion 28 may be similar to the respective layers of memory array portion 100 in FIG. 6. As such bit line 22, digits lines 30, storing portion 26, and pinned portion 28 may include similar materials and thicknesses as those described in FIG. 6 for the respective layers and portions. Memory array portion 130, however, includes storing portion 26 and pinned portion 28 arranged a different configuration than as in FIG. 6. More specifically, memory array portion 130 includes pinned portion 28 arranged above storing portion 26. In this manner, low temperature AF layer 104 may be closer to digit lines 30 than it is to bit line 22. Such a configuration may be particularly advantageous in applications in which digits lines 30 are used to heat low temperature AF layer 104 as explained above in reference to FIGS. 3–5c. More specifically, the configuration illustrated in FIG. 10 may allow a greater amount of heat generated from digit lines 30 to contribute to the heating of low temperature AF layer 104.

In some embodiments, the configuration of FIG. 10 may further include a high thermal conducting dielectric layer interposed between the digit lines 30 and electrodes 32. For example, memory array portion 130 may include dielectric layer 132. A dielectric layer including relatively high thermal conducting properties may advantageously allow heat to diffuse from digit lines 30 to the memory cell junctions of memory array portion 130. In this manner, low temperature AF layer 104 may be heated in an efficient manner, allowing the writing operation to be faster and/or allow smaller currents to be used. Exemplary materials for dielectric layer 132 may include aluminum oxide, aluminum nitride, or zirconium oxide. The thickness of dielectric layer 132 between electrodes 32 and digit lines 30 may be between approximately 50 angstroms and approximately 200 angstroms. However, larger or smaller thicknesses of dielectric layer 132 in such a region may be used, depending on the design specifications of the device.

It is noted that the inclusion of a different dielectric layer to isolate magnetic cell junctions 21 and 23 from digit lines 30 and the rearrangement of storing portion 26 and pinned portion 28 illustrated in FIG. 10 are not mutually exclusive for the device described herein. In other words, other embodiments of upper portions of memory array 20 may include an alternative dielectric material between digit lines 30 and magnetic cell junctions 21 and 23 while storing portion 26 is arranged above pinned portion 28. Likewise, other embodiments of upper portions of memory array 20 may include pinned portion 28 arranged above storing portion 26 without the inclusion of an alternative dielectric layer between digit lines 30 and magnetic cell junctions 21 and 23.

Furthermore, it is noted that the differences highlighted in reference to FIGS. 6–8 and 10 relative to each other are not mutually exclusive. As such, a plurality of insulating layers may be arranged in memory array portion 100 as well as memory array portion 130. Moreover, in some embodiments, an additional pinned portion and/or an additional storing portion may be arranged within memory array portions 100, 120, and 130. In yet another embodiment, the configuration shown in FIG. 7 may alternatively be absent of an insulating layer arranged upon storing portion 26. Likewise, memory array portions 100 and 130 may not include digit lines 30, in some embodiments. On the contrary, digit lines may be included in memory array portions 120 and 128. Furthermore, pinned portion 28 may be arranged above storing portion 26 within memory array portions 100, 120 and 128. In addition, memory array portion 130 may alternatively include pinned portion 28 arranged below storing portion 26. Moreover, dielectric layer 132 may be included between digit lines 30 and magnetic junctions 21 and 23 of memory array portion 120, while memory array portion 130 may be substantially absent of such a thermally conductive dielectric layer.

It will be appreciated to those skilled in the art having the benefit of this disclosure that this invention is believed to provide a magnetic memory cell configuration and a method for writing to an array of memory cells including such a configuration. Further modifications and alternative embodiments of various aspects of the invention will be apparent to those skilled in the art in view of this description. For example, the dimensions of the magnetic cell junction described herein are not limited by the method of writing or the configuration provided herein. As such, as new patterning technologies are developed for dimensions smaller than 0.1 $\mu$m, the method and configuration described herein may be applied to cell junctions with such dimensions. It is intended that the following claims be interpreted to embrace all such modifications and changes and, accordingly, the specification and drawings are to be regarded in an illustrative rather than a restrictive sense.

What is claimed is:

1. A memory cell comprising a magnetic cell junction, wherein the magnetic cell junction comprises a storing portion adapted to characterize a logic state of a bit written to the magnetic cell junction, and wherein the storing portion comprises an antiferromagnetic layer arranged in contact with an adjacent magnetic layer.

2. The memory cell of claim 1, comprising a conductive layer coupled to the magnetic cell junction, wherein the conductive layer is adapted to:
   supply current through the magnetic cell junction to heat the antiferromagnetic layer; and
   induce a magnetic field about the magnetic cell junction to set a magnetic direction of the storing portion.

3. The memory cell of claim 2, substantially absent of another conductive layer adapted to induce a magnetic field about the magnetic cell junction.

4. The memory cell of claim 2, further comprising a transistor coupled to the magnetic cell junction, wherein the transistor is adapted to receive the current from the conductive layer and is orientated such that the current flows through the transistor in a perpendicular manner with respect to an underlying substrate of the memory cell.

5. The memory cell of claim 1, comprising a conductive layer spaced below the magnetic cell junction, wherein the conductive layer is adapted to supply current adjacent to the magnetic cell junction to heat the antiferromagnetic layer.

6. The memory cell of claim 1, wherein the storing portion is interposed between a plurality of insulating layers.

7. The memory cell of claim 6, wherein one of the plurality of insulating layers is arranged between the storing portion and the reference portion, and wherein another of the plurality of insulating layers is arranged between two additional magnetic layers of the magnetic cell junction.

8. The memory cell of claim 1, wherein the magnetic cell junction further comprises a reference portion arranged above the storing portion, wherein the reference portion is adapted to retain a fixed magnetic direction for the characterization of the logic state by the storing portion.

9. A method for writing a bit to a memory cell, comprising:
  decoupling an antiferromagnetic layer and an adjacent magnetic layer arranged within a magnetic junction of the memory cell; and
  setting a magnetic direction of the decoupled adjacent magnetic layer.

10. The method of claim 9, wherein the step of decoupling comprises transforming the adjacent magnetic layer from a ferromagnetic state to a superparamagnetic state.

11. The method of claim 9, wherein the step of decoupling comprises heating the antiferromagnetic layer above a blocking temperature of the antiferromagnetic layer, and wherein the step of setting a magnetic direction comprises inducing a magnetic field about the magnetic junction.

12. The method of claim 11, wherein the step of heating comprises flowing current vertically through the magnetic junction.

13. The method of claim 12, wherein the step of heating further comprises supplying complementary heat from a conductive line spaced adjacent to the magnetic junction.

14. The method of claim 9, further comprising cooling the antiferromagnetic layer to couple the antiferromagnetic layer and the adjacent magnetic layer in the set magnetic direction.

15. A memory cell with a magnetic cell junction comprising an aspect ratio less than approximately 1.6.

16. The memory cell of claim 15, wherein the magnetic cell junction comprises a substantially circular shape.

17. The memory cell of claim 15, comprising a surface area less than approximately 1.0 $\mu m^2$.

18. The memory cell of claim 15, wherein the magnetic cell junction comprises a plurality of antiferromagnetic layers.

19. A memory cell comprising a magnetic cell junction with at least two resistors, wherein the magnetic cell junction is bound by a first electrode arranged in contact with a data line of the memory cell and a second electrode arranged in contact with a contact structure of the memory cell.

20. The memory cell of claim 19, wherein all of the resistors are variable resistors.

21. The memory cell of claim 19, wherein at least one of the resistors is a fixed resistor.

22. The memory cell of claim 19, wherein two of the resistors respectively comprise a tunneling junction.

23. The memory cell of claim 22, wherein the two resistors comprise a joint antiferromagnetic layer.

24. The memory cell of claim 19, wherein one of the resistors comprises a tunneling junction, and wherein another of the resistors comprises an insulating layer arranged between a storing portion of the tunneling junction and one of the first and second electrodes.

* * * * *

UNITED STATES PATENT AND TRADEMARK OFFICE
Certificate

Patent No. 6,980,468 B1                                      Patented: December 27, 2005

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Kamel Ounadjela, San Jose, CA (US); Bernard Diény, Lans en Vercors (FR); and Oliver Redon, Seyssinet-Pariset (FR).

Signed and Sealed this First Day of September 2009.

*RICHARD T. ELMS*
*Supervisory Patent Examiner*
*Art Unit 2835*

UNITED STATES PATENT AND TRADEMARK OFFICE
Certificate

Patent No. 6,980,468 B1                                                                                             Patented: December 27, 2005

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Kamel Ounadjela, San Jose, CA (US); Bernard Diény, Lans en Vercors (FR); and Oliver Redon, Seyssinet-Pariset (FR).

Signed and Sealed this Twenty-Second Day of September 2009.

RICHARD T. ELMS
*Supervisory Patent Examiner*
Art Unit 2836